US008919975B2

(12) United States Patent
van de Ven et al.

(10) Patent No.: US 8,919,975 B2
(45) Date of Patent: Dec. 30, 2014

(54) LIGHTING DEVICE PROVIDING IMPROVED COLOR RENDERING

(75) Inventors: Antony Paul van de Ven, Sai Kung (HK); Gerald H Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 225 days.

(21) Appl. No.: 13/292,541

(22) Filed: Nov. 9, 2011

(65) Prior Publication Data

US 2013/0114241 A1 May 9, 2013

(51) Int. Cl.

| | |
|---|---|
| ***F21V 9/16*** | (2006.01) |
| ***H01L 33/00*** | (2010.01) |
| ***H01J 1/62*** | (2006.01) |
| ***H05B 33/08*** | (2006.01) |
| *F21Y 113/00* | (2006.01) |

(52) U.S. Cl.

CPC ....... *H05B 33/0863* (2013.01); *F21Y 2113/005* (2013.01); *H05B 33/0866* (2013.01)

USPC ........ 362/84; 362/231; 362/249.02; 313/501; 313/483

(58) Field of Classification Search

USPC ...................................... 362/231, 84, 249.02

See application file for complete search history.

(56) References Cited

U.S. PATENT DOCUMENTS

| | | | | |
|---|---|---|---|---|
| 7,213,940 | B1 | 5/2007 | van de Ven et al. | |
| 7,768,192 | B2 | 8/2010 | van de Ven et al. | |
| 7,918,581 | B2 | 4/2011 | van de Ven et al. | |
| 8,125,137 | B2 * | 2/2012 | Medendorp et al. | 313/501 |
| 8,247,959 | B2 * | 8/2012 | Beers et al. | 313/486 |
| 8,410,680 | B2 * | 4/2013 | Medendorp et al. | 313/501 |
| 8,508,127 | B2 * | 8/2013 | Negley et al. | 313/512 |
| 2005/0127381 | A1 * | 6/2005 | Vitta et al. | 257/88 |
| 2007/0069643 | A1 * | 3/2007 | Brunner et al. | 313/512 |
| 2007/0139920 | A1 | 6/2007 | Van De Ven et al. | |
| 2008/0106895 | A1 | 5/2008 | van de Ven et al. | |
| 2009/0160363 | A1 | 6/2009 | Negley et al. | |
| 2009/0184616 | A1 | 7/2009 | van de Ven et al. | |
| 2009/0296384 | A1 | 12/2009 | van de Ven et al. | |
| 2010/0165645 | A1 * | 7/2010 | Lee et al. | 362/373 |
| 2010/0254129 | A1 | 10/2010 | le Toquin et al. | |
| 2010/0254130 | A1 * | 10/2010 | Van De Ven et al. | 362/231 |
| 2011/0148327 | A1 | 6/2011 | Van De Ven et al. | |
| 2011/0180804 | A1 * | 7/2011 | Su et al. | 257/76 |
| 2013/0114242 | A1 * | 5/2013 | Pickard et al. | 362/84 |

FOREIGN PATENT DOCUMENTS

WO 2008137983 A1 11/2008

OTHER PUBLICATIONS

International Search Report for International Patent Application PCT/US2012/064074 mailed Jan. 24, 2013, 11 pages.

Van De Ven et al., "Warm white illumination with high CRI and high efficacy by combining 455nm excited yellowish phosphor LEDs and red AlInGaP LEDs," First International Conference on White LEDs and Solid State Lighting, Nov. 28, 2007, 8 pages.

Van De Ven et al., "Essentials of designing efficient luminaires with LEDS," Ledsmagazine.com, Jan./Feb. 2008, pp. 17-22.

International Preliminary Report on Patentability for PCT/US2012/064074, mailed May 22, 2014, 7 pages.

* cited by examiner

*Primary Examiner* — Sikha Roy

(74) *Attorney, Agent, or Firm* — Withrow & Terranova, P.L.L.C.

(57) ABSTRACT

The present disclosure relates to lighting device configurations that render colors well and provide high quality white light.

49 Claims, 21 Drawing Sheets

LIGHTING DEVICE PROVIDING IMPROVED COLOR RENDERING

FIELD OF THE DISCLOSURE

The present disclosure relates to a high quality solid-state lighting device that produces white light that renders colors well.

BACKGROUND

The color quality of a light source relates to the ability of the light source to faithfully reproduce the colors of objects illuminated by the light source, in comparison with natural light. As expected, the color quality of the light source is an important characteristic of the light source in general, and to consumers in particular. Most consumers want an object that appears red in natural light to appear the same color of red when illuminated by the light source. For example, a light source with poor color quality may cause the red object to appear anywhere from orange to brown when illuminated.

The Color Rendering Index (CRI) is a measure of the relative color quality of a light source with respect to natural light. The CRI is the only internationally accepted standard for measuring color quality and is defined by the International Commission on Illumination (CIE or Commission internationale de l'éclairage). At a high level, the CRI for a light source is calculated by initially measuring the color appearance of 14 reflective samples of different defined hues under both a reference source and the light source being measured. The measured color appearances are then modified for chromatic adaptation with a Von Kires correction. After modification, the difference in the color appearance for each reflective sample i is referred to as the color appearance difference, $\Delta E_i$.

Based on the corresponding color appearance difference, $\Delta E_i$, a special CRI, $R_i$, is calculated for each reflective sample using the formula: $R_i = 100 - 4.6\Delta E_i$. To calculate the general CRI, $R_a$, for the light source, an average of the special CRI, $R_i$ for only the first eight of the reflective samples is calculated, wherein:

$$R_a = \frac{1}{8}\sum_{i=1}^{8} R_i$$

A perfect CRI of indicates that there are essentially no color differences for any of the eight reflective samples that are used to calculate the general CRI $R_a$.

For reference, natural sunlight has a high CRI $R_a$ of approximately 100, and incandescent light has a CRI $R_a$ of 95 or greater. Florescent lighting is less accurate and generally has a CRI $R_a$ of 70-80, which is on the lower end of what is acceptable for residential and indoor commercial lighting applications. Street lamps that use mercury vapor or sodium lamps often have a relatively poor CRI $R_a$ of around 40 or lower.

Unfortunately, the CRI of a light source only considers color rendering, as the name implies, and ignores many other attributes that impact overall color quality, such as chromatic discrimination and common observer preferences. Even as a measure of color rendering, CRI is calculated using only eight of the 14 reflective samples, as noted above. These eight reflective samples are all of low to medium chromatic saturation and do not span the range of normal visible colors. Thus, the CRI calculations do not take into consideration the ability of the light source to properly render highly saturated colors. As a result, light sources that render colors of low saturation well, but perform poorly with highly saturated colors, can achieve relatively high CRIs while light sources that afford high chromatic discrimination, are pleasing to the common observer, and perform relatively well for colors at all saturation levels may have a relatively low CRI.

The use of the CRI as a reliable color quality metric for solid-state lighting sources, such as those employing light emitting diodes (LEDs), is particularly problematic given the inherently peaked light spectrum of LEDs. Depending on how the spectrum of a given LED light source aligns with the reflective samples used to calculate the CRI, the resulting CRI may not be a fair representation of the perceived color quality of the LED light source in comparison with other LED light sources with different light spectra as well as with other traditional light sources. For example, a well-designed LED lighting source with a lower CRI $R_a$ of 80 may be perceived as having a much more accurate and pleasing color rendering than a florescent lighting source with same CRI $R_a$ of 80. Similarly, a first LED lighting source that is engineered to achieve a higher CRI $R_a$ of 90 may not be perceived as being able to render colors as well as a second LED lighting source with a lower CRI $R_a$.

Given the limitations of the CRI as a measure of color quality for solid-state lighting devices, a new color quality metric, which is referred to as the Color Quality Scale (CQS), has been developed by the National Institute of Standards and Technology (NIST). Instead of using only eight low-chroma samples that do not span the full range of hues, the CQS takes in to consideration 15 Munsell samples that have much higher chroma and are spaced evenly along the entire hue circle. CQS also takes in to consideration various other characteristics that have been determined to impact an observer's perception of color quality. The CQS has a range of 0-100, with 100 being a perfect score. The details of how CQS is measured as of the date of filing is provided in Appendix A, an article entitled "Color Rendering of Light Sources," from the National Institute of Standards and Technology web site (http://physics.nist.gov/Divisions/Div844/facilities/vision/color.html), accessed on Mar. 11, 2009 and incorporated herein by reference in its entirety.

Given the limitations of CRI for grading the color quality of solid-state lighting sources, there is a need for solid-state lighting devices that render colors in a pleasing manner regardless of the measured CRI $R_a$. There is a further need for solid-state lighting devices that render colors having a relatively high CQS measurement regardless of the measured CRI $R_a$.

SUMMARY

The present disclosure relates to various lighting device configurations that render colors well and provide high quality white light. The first configuration employs blue shifted yellow (BSY) LEDs and red LEDs. The peak wavelength of the blue excitation light emitted by the blue LED chips of the BSY LEDs is 410 to 490 nm; the dominant wavelength of the yellow phosphor associated with the BSY LEDs is 535 to 590 nm; and the dominant wavelength of the red LEDs is 631 to 700 nm. The light from the BSY LEDs may have a color point having coordinates that fall within a first BSY color space, which is defined by the set of points (0.29, 0.36), (0.38, 0.53), (0.44, 0.49), (0.41, 0.43), and (0.32, 0.35), or a second BSY color space, which is defined by the set of points (0.32, 0.40), (0.36, 0.48), (0.43, 0.45), (0.42, 0.42), and (0.36, 0.38), on the 1931 CIE chromaticity diagram.

The second configuration for high CQS employs BSY LEDs and red LEDs. The peak wavelength of the blue excitation light emitted by the blue LED chips of the BSY LEDs is 410 to 490 nm; the dominant wavelength of the yellow phosphor associated with the BSY LEDs is 535 to 590 nm; and the dominant wavelength of the red LEDs is 641 to 700 nm. The light from the BSY LEDs may have a color point having coordinates that fall within the first or second BSY color space.

The third configuration for high CQS employs BSY LEDs and red LEDs. The peak wavelength of the blue excitation light emitted by the blue LED chips of the BSY LEDs is 410 to 490 nm; the dominant wavelength of the yellow phosphor associated with the BSY LEDs is 535 to 590 nm; and the dominant wavelength of the red LEDs is 641 to 680 nm. The light from the BSY LEDs may have a color point having coordinates that fall within the first or second BSY color space.

The fourth configuration for high CQS employs BSY LEDs and red LEDs. The peak wavelength of the blue excitation light emitted by the blue LED chips of the BSY LEDs is 430 to 480 nm; the dominant wavelength of the yellow phosphor associated with the BSY LEDs is 566 to 585 nm; and the dominant wavelength of the red LEDs is 631 to 680 nm. The light from the BSY LEDs may have a color point having coordinates that fall within the first or second BSY color space.

The fifth configuration for high CQS employs BSY LEDs and red LEDs. The peak wavelength of the blue excitation light emitted by the blue LED chips of the BSY LEDs is 430 to 480 nm; the dominant wavelength of the yellow phosphor associated with the BSY LEDs is 566 to 585 nm; and the dominant wavelength of the red LEDs is 641 to 680 nm. The light from the BSY LEDs may have a color point having coordinates that fall within the first or second BSY color space.

The sixth configuration for high CQS employs BSY LEDs $\mathbf{52}_{BSY}$ and red LEDs. The peak wavelength of the blue excitation light emitted by the blue LED chips of the BSY LEDs is 445 to 470 nm; the dominant wavelength of the yellow phosphor associated with the BSY LEDs is 566 to 575 nm; and the dominant wavelength of the red LEDs is 605 to 650 nm. The light from the BSY LEDs may have a color point having coordinates that fall within the first or second BSY color space. Further, the resultant white light may be between about 2700K and 4000K and may obtain a CQS measurement equal to or greater than 90.

For a more optimized CQS measure greater than 90 and for white light between 2700K and 4000K, the peak wavelength of the blue excitation light emitted by the blue LED chips of the BSY LEDs is 448 to 468 nm; the dominant wavelength of the yellow phosphor associated with the BSY LEDs is 568 to 573 nm; and the dominant wavelength of the red LEDs is 615 to 645 nm. The light from the BSY LEDs may have a color point having coordinates that fall within the first or second BSY color space.

For a CQS measure of 85 or greater, the peak wavelength of the blue excitation light emitted by the blue LED chips of the BSY LEDs is 430 to 480 nm; the dominant wavelength of the yellow phosphor associated with the BSY LEDs is 560 to 580 nm; and the dominant wavelength of the red LEDs is 605 to 660 nm. The light from the BSY LEDs may have a color point having coordinates that fall within the first or second BSY color space. Again, the resultant white light may be between about 2700K and 4000K.

The seventh configuration for high CQS employs blue shifted green (BSG) LEDs and red LEDs. The peak wavelength of the blue excitation light emitted by the blue LED chips of the BSG LEDs is 430 to 480 nm; the dominant wavelength of the green phosphor associated with the BSG LEDs is 540 to 560 nm; and the dominant wavelength of the red LEDs is 605 to 640 nm. The light from the BSG LEDs may have a color point having coordinates that fall within either a first BSG color space, which is defined by the points (0.13, 0.26), (0.35, 0.48), (0.26, 0.50), and (0.15, 0.20), or a second BSG color space, which is defined by the points (0.21, 0.28), (0.28, 0.44), (0.32, 0.42), and (0.26, 0.28), on the 1931 CIE chromaticity diagram. Further, the resultant white light may be between about 4000K and 6500K and may obtain a CQS measurement equal to or greater than 90.

For a more optimized CQS measure greater than 90 and for white light between 4000K and 65000K, the peak wavelength of the blue excitation light emitted by the blue LED chips of the BSG LEDs is 430 to 470 nm; the dominant wavelength of the green phosphor associated with the BSG LEDs is 540 to 560 nm; and the dominant wavelength of the red LEDs is 609 to 630 nm. The light from the BSG LEDs may have a color point having coordinates that fall within the first or second BSG color space.

For a CQS measure of 85 or greater, the peak wavelength of the blue excitation light emitted by the blue LED chips of the BSG LEDs is 420 to 480 nm; the dominant wavelength of the green phosphor associated with the BSG LEDs is 540 to 560 nm; and the dominant wavelength of the red LEDs is 590 to 660 nm. The light from the BSG LEDs may have a color point having coordinates that fall within the first or second BSG color space. Again, the resultant white light is between about 4000K and 6500K.

The eighth configuration for high CQS employs red LEDs $\mathbf{52}_R$ and either BSY or BSG LEDs. The peak wavelength of the blue excitation light emitted by the blue LED chips of the BSY or BSG LEDs is 410 to 490 nm; the dominant wavelength of the yellow or green phosphor associated with the BSY or BSG LEDs is 535 to 590 nm; and the dominant wavelength of the red LEDs is 590 to 700 nm. The light from the BSG LEDs may have a color point having coordinates that fall within the first or second BSY or BSG color spaces. In this configuration, peak wavelength of the blue excitation light emitted by the blue LED chips of the BSY or BSG LEDs, the dominant wavelength of the yellow or green phosphor associated with the BSY or BSG LEDs, and the dominant wavelength of the red LEDs can be selected to provide one of the following characteristics:

a CQS measurement ≥90;

a CQS measurement ≥85;

a CQS measurement ≥90 and a CRI $R_a$≥90;

a CQS measurement ≥85 and a CRI $R_a$≥85;

a CQS measurement ≥90 and a CRI $R_a$<90; and a CQS measurement ≥85 and a CRI $R_a$<85.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

Figure 1:
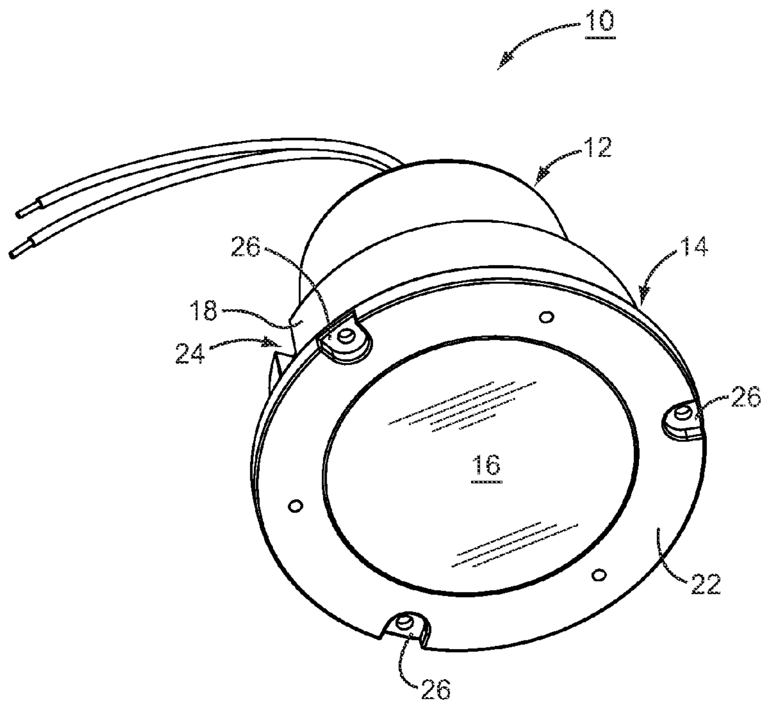
FIG. 1 is an isometric view of the front of an exemplary lighting fixture in which a lighting device according to one embodiment of the disclosure may be implemented.
Figure 2:
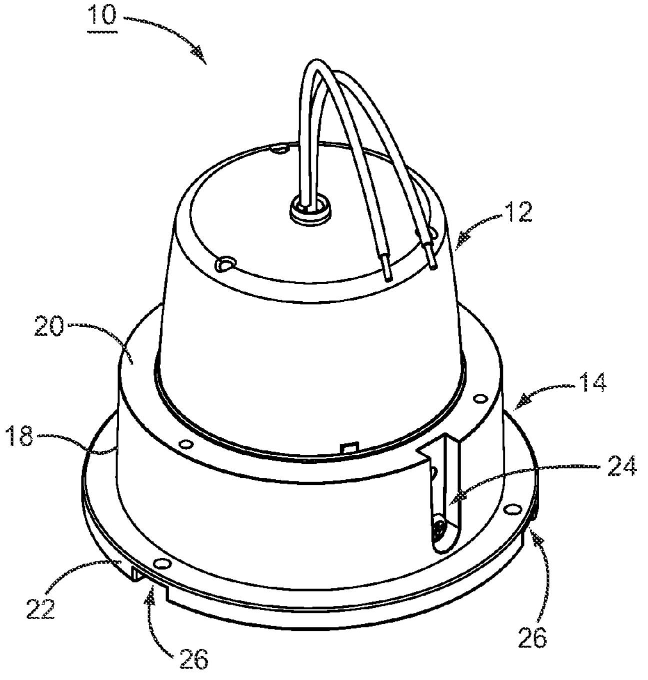
FIG. 2 is an isometric view of the back of the lighting fixture of FIG. 1.

The present disclosure relates to a solid-state lighting device with improved color rendering. For context and ease of understanding, the following description first describes an exemplary solid-state lighting fixture prior to describing how the solid-state lighting fixture may be configured to provide improved color rendering. With reference to FIGS. 1 and 2, a unique lighting fixture 10 is illustrated according to one embodiment of the present disclosure. While this particular lighting fixture 10 is used for reference, those skilled in the art will recognize that virtually any type of solid-state lighting fixture may benefit from the subject disclosure.

As shown, the lighting fixture 10 includes a control module 12, a mounting structure 14, and a lens 16. The illustrated mounting structure 14 is cup-shaped and is capable of acting as a heat spreading device; however, different fixtures may include different mounting structures 14 that may or may not act as heat spreading devices. A light source (not shown), which will be described in detail further below, is mounted inside the mounting structure 14 and oriented such that light is emitted from the mounting structure through the lens 16. The electronics (not shown) that are required to power and drive the light source are provided, at least in part, by the control module 12. While the lighting fixture 10 is envisioned to be used predominantly in 4, 5, and 6 inch recessed lighting applications for industrial, commercial, and residential applications, those skilled in the art will recognize that the concepts disclosed herein are applicable to virtually any size and application.

The lens 16 may include one or more lenses that are made of clear or transparent materials, such as polycarbonate or acrylic glass or any other suitable material. As discussed further below, the lens 16 may be associated with a diffuser for diffusing the light emanating from the light source and exiting the mounting structure 14 via the lens 16. Further, the lens 16 may also be configured to shape or direct the light exiting the mounting structure 14 via the lens 16 in a desired manner.

The control module 12 and the mounting structure 14 may be integrated and provided by a single structure. Alternatively, the control module 12 and the mounting structure 14 may be modular wherein different sizes, shapes, and types of control modules 12 may be attached, or otherwise connected, to the mounting structure 14 and used to drive the light source provided therein.

In the illustrated embodiment, the mounting structure 14 is cup-shaped and includes a sidewall 18 that extends between a bottom panel 20 at the rear of the mounting structure 14, and a rim, which may be provided by an annular flange 22 at the front of the mounting structure 14. One or more elongated slots 24 may be formed in the outside surface of the sidewall 18. There are two elongated slots 24, which extend parallel to a central axis of the lighting fixture 10 from the rear surface of the bottom panel 20 toward, but not completely to, the annular flange 22. The elongated slots 24 may be used for a variety of purposes, such as providing a channel for a grounding wire that is connected to the mounting structure 14 inside the elongated slot 24, connecting additional elements to the lighting fixture 10, or as described further below, securely attaching the lens 16 to the mounting structure 14.

The annular flange 22 may include one or more mounting recesses 26 in which mounting holes are provided. The mounting holes may be used for mounting the lighting fixture 10 to a mounting structure or for mounting accessories to the lighting fixture 10. The mounting recesses 26 provide for counter-sinking the heads of bolts, screws, or other attachment means below or into the front surface of the annular flange 22.

Figure 3:
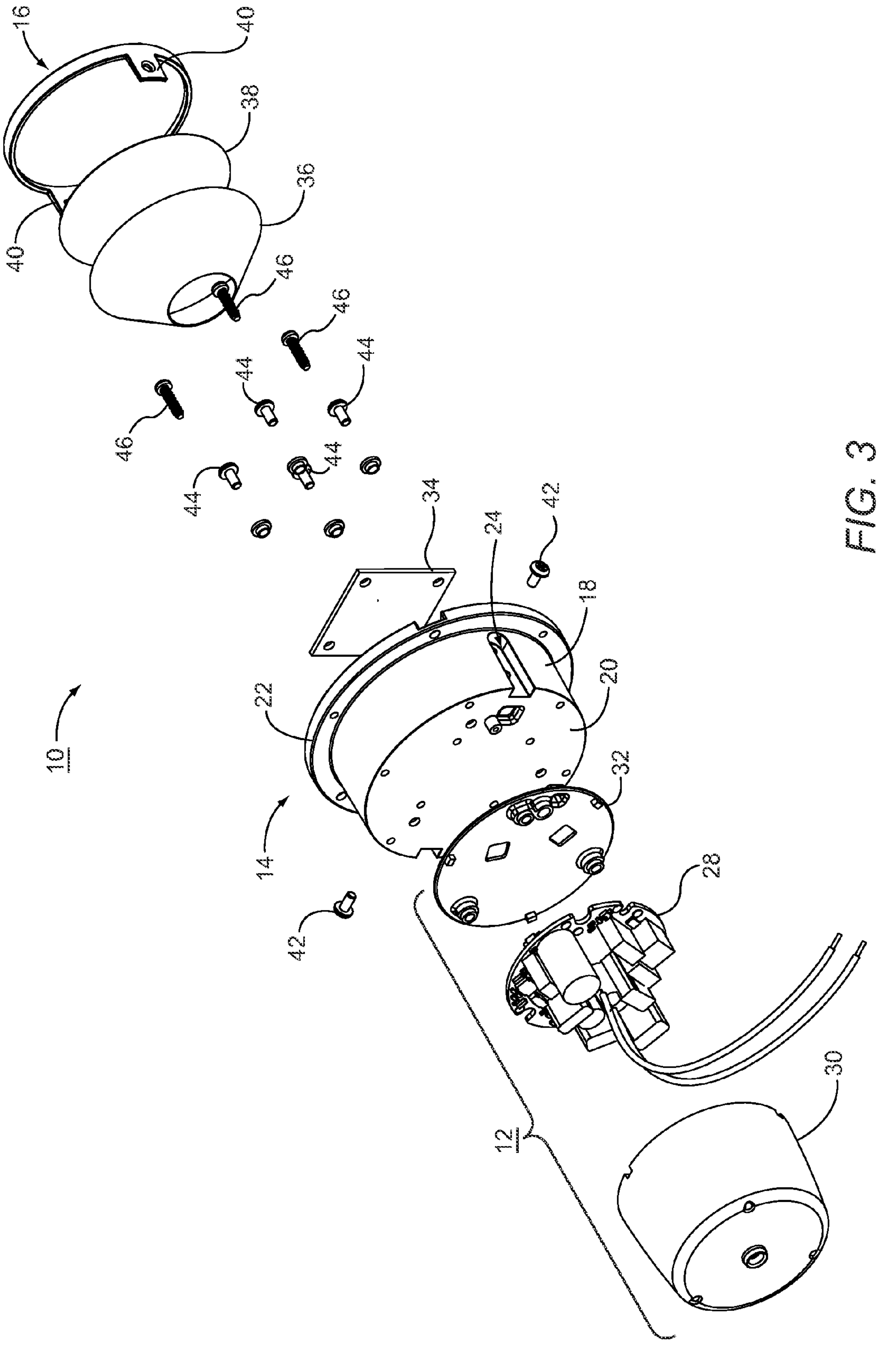
FIG. 3 is an exploded isometric view of the lighting fixture of FIG. 1.

With reference to FIG. 3, an exploded view of the lighting fixture 10 of FIGS. 1 and 2 is provided. As illustrated, the control module 12 includes control module electronics 28, which are encapsulated by a control module housing 30 and a control module cover 32. The control module housing 30 is cup-shaped and sized sufficiently to receive the control module electronics 28. The control module cover 32 provides a cover that extends substantially over the opening of the control module housing 30. Once the control module cover 32 is in place, the control module electronics 28 are contained within the control module housing 30 and the control module cover 32. The control module 12 is, in the illustrated embodiment, mounted to the rear surface of the bottom panel 20 of the mounting structure 14.

The control module electronics 28 may be used to provide all or a portion of power and control signals necessary to power and control the light source 34, which may be mounted on the front surface of the bottom panel 20 of the mounting structure 14 as shown, or in an aperture provided in the bottom panel 20 (not shown). Aligned holes or openings in the bottom panel 20 of the mounting structure 14 and the control module cover 32 are provided to facilitate an electrical connection between the control module electronics 28 and the light source 34. In an alternative embodiment (not shown), the control module 12 may provide a threaded base that is configured to screw into a conventional light socket wherein the lighting fixture resembles or is at least a compatible replacement for a conventional light bulb. Power to the lighting fixture 10 would be provided via this base.

In the illustrated embodiment, the light source 34 is solid state and employs light emitting diodes (LEDs) and associated electronics, which are mounted to a printed circuit board (PCB) to generate light at a desired color, intensity and color temperature. The LEDs are mounted on the front side of the PCB while the rear side of the PCB is mounted to the front surface of the bottom panel 20 of the mounting structure 14 directly or via a thermally conductive pad (not shown). In this embodiment, the thermally conductive pad has a low thermal resistivity, and therefore, efficiently transfers heat that is generated by the light source 34 to the bottom panel 20 of the mounting structure 14.

While various mounting mechanisms are available, the illustrated embodiment employs four bolts 44 to attach the PCB of the light source 34 to the front surface of the bottom panel 20 of the mounting structure 14. The bolts 44 screw into threaded holes provided in the front surface of the bottom panel 20 of the mounting structure 14. Three bolts 46 are used to attach the mounting structure 14 to the control module 12. In this particular configuration, the bolts 46 extend through corresponding holes provided in the mounting structure 14 and the control module cover 32 and screw into threaded apertures (not shown) provided just inside the rim of the control module housing 30. As such, the bolts 46 effectively sandwich the control module cover 32 between the mounting structure 14 and the control module housing 30.

A reflector cone 36 resides within the interior chamber provided by the mounting structure 14. In the illustrated embodiment, the reflector cone 36 has a conical wall that extends between a larger front opening and a smaller rear opening. The larger front opening resides at and substantially corresponds to the dimensions of front opening in the mounting structure 14 that corresponds to the front of the interior chamber provided by the mounting structure 14. The smaller rear opening of the reflector cone 36 resides about and substantially corresponds to the size of the LED or array of LEDs provided by the light source 34. The front surface of the reflector cone 36 is generally, but not necessarily, highly reflective in an effort to increase the overall efficiency and optical performance of the lighting fixture 10. In certain embodiments, the reflector cone 36 is formed from metal, paper, a polymer, or a combination thereof. In essence, the reflector cone 36 provides a mixing chamber for light emitted from the light source 34 and may be used to help direct or control how the light exits the mixing chamber through the lens 16.

Figure 4:
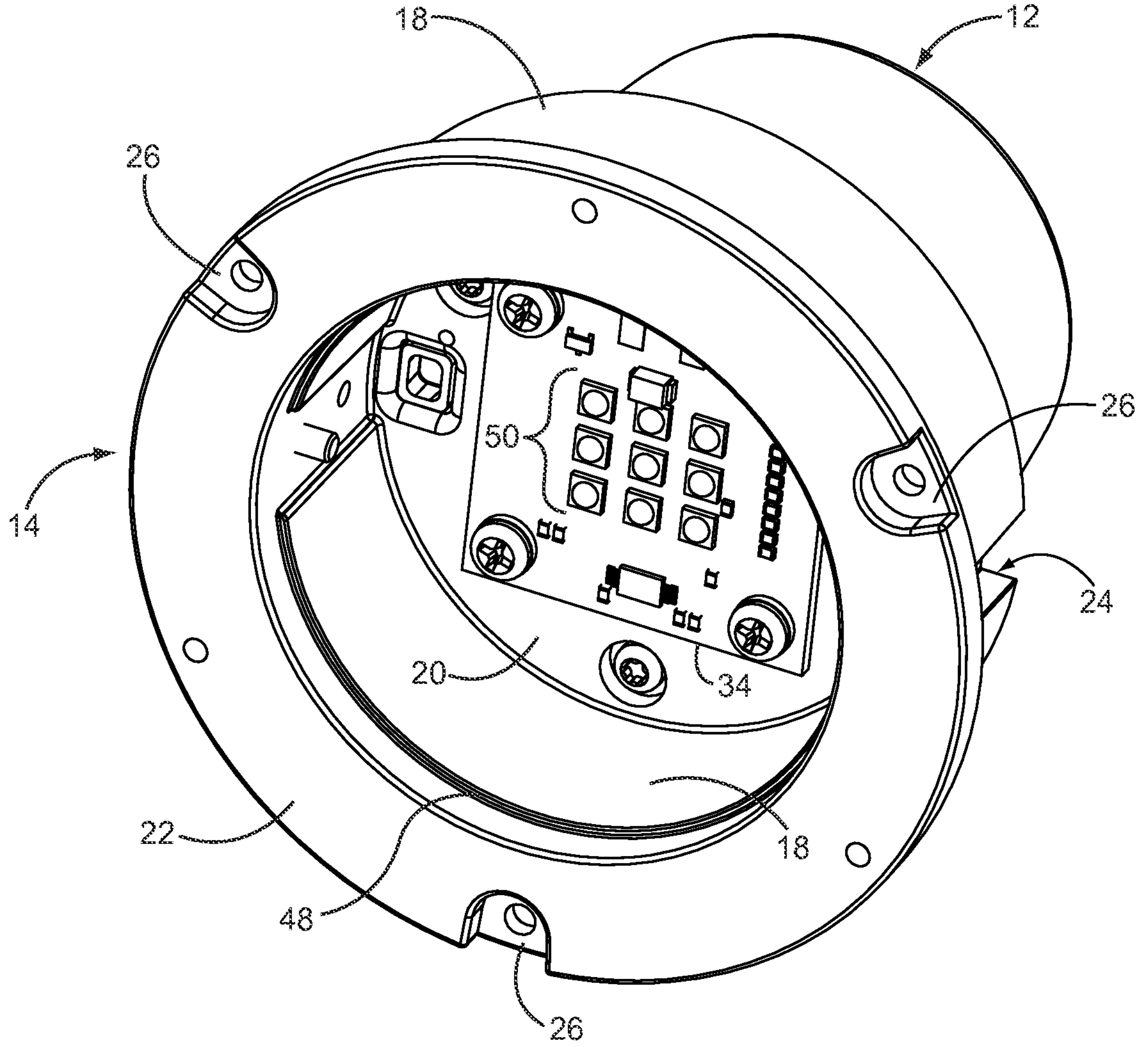
FIG. 4 is an isometric view of the front of the lighting fixture of FIG. 1 without the lens, diffuser, and reflector.
Figure 5:
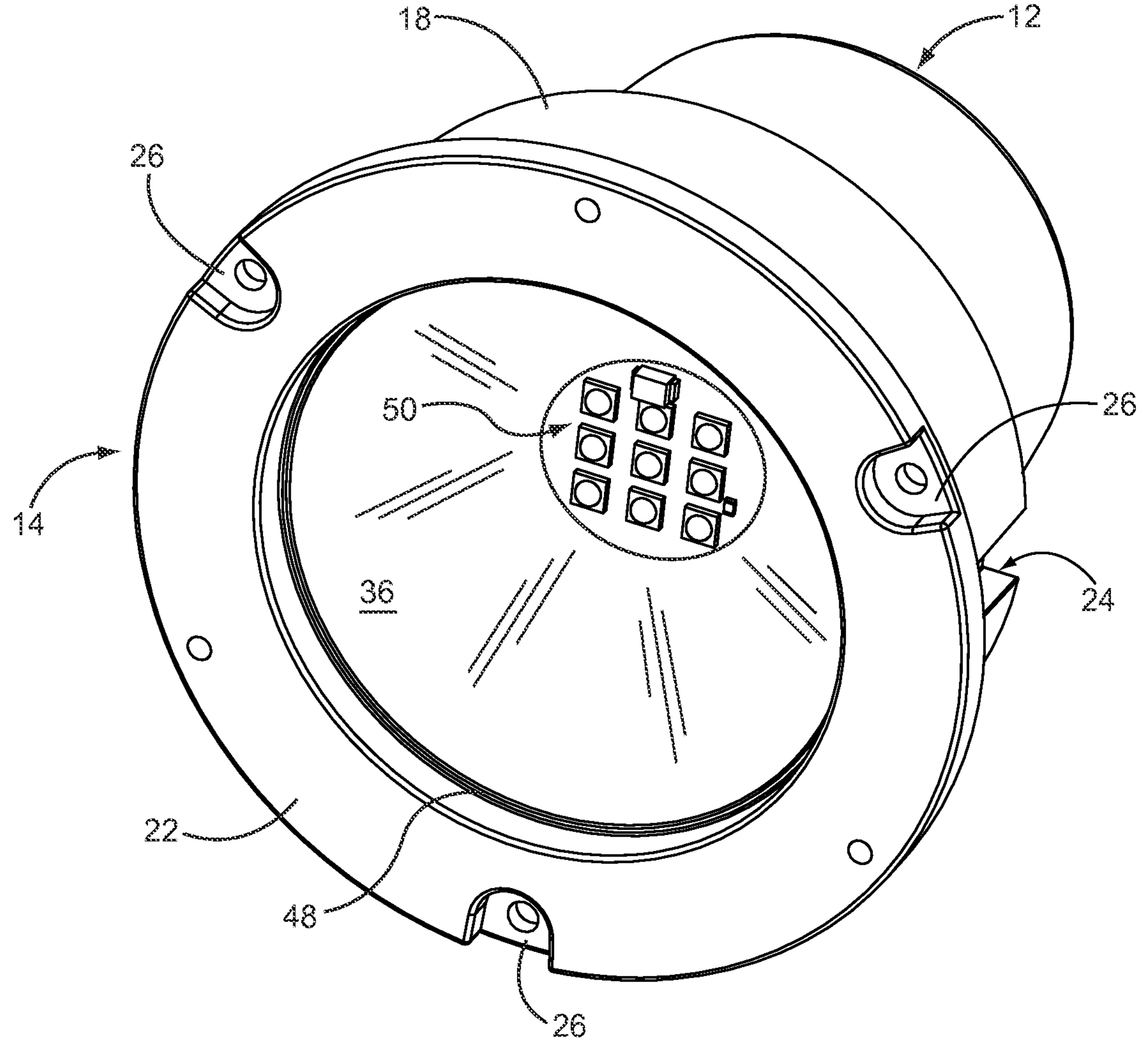
FIG. 5 is an isometric view of the front of the lighting fixture of FIG. 1 without the lens and diffuser.

When assembled, the lens 16 is mounted on or over the annular flange 22 and may be used to hold the reflector cone 36 in place within the interior chamber of the mounting structure 14 as well as hold additional lenses and one or more planar diffusers 38 in place. In the illustrated embodiment, the lens 16 and the diffuser 38 generally correspond in shape and size to the front opening of the mounting structure 14 and are mounted such that the front surface of the lens 16 is substantially flush with the front surface of the annular flange 22. As shown in FIGS. 4 and 5, a recess 48 is provided on the interior surface of the sidewall 18 and substantially around the opening of the mounting structure 14. The recess 48 provides a ledge on which the diffuser 38 and the lens 16 rest inside the mounting structure 14. The recess 48 may be sufficiently deep such that the front surface of the lens 16 is flush with the front surface of the annular flange 22.

Returning to FIG. 3, the lens 16 may include tabs 40, which extend rearward from the outer periphery of the lens 16. The tabs 40 may slide into corresponding channels on the interior surface of the sidewall 18 (see FIG. 4). The channels are aligned with corresponding elongated slots 24 on the exterior of the sidewall 18. The tabs 40 have threaded holes that align with holes provided in the grooves and elongated slots 24. When the lens 16 resides in the recess 48 at the front opening of the mounting structure 14, the holes in the tabs 40 will align with the holes in the elongated slots 24. Bolts 42 may be inserted through the holes in the elongated slots and screwed into the holes provided in the tabs 40 to affix the lens 16 to the mounting structure 14. When the lens 16 is secured, the diffuser 38 is sandwiched between the lens and the recess 48, and the reflector cone 36 is contained between the diffuser 38 and the light source 34. Alternatively, a retention ring (not shown) may attach to the flange 22 of the mounting structure 14 and operate to hold the lens 16 and diffuser 38 in place.

The degree and type of diffusion provided by the diffuser 38 may vary from one embodiment to another. Further, color, translucency, or opaqueness of the diffuser 38 may vary from one embodiment to another. Separate diffusers 38, such as that illustrated in FIG. 3, are typically formed from a polymer, glass, or thermoplastic, but other materials are viable and will be appreciated by those skilled in the art. Similarly, the lens 16 is planar and generally corresponds to the shape and size of the diffuser 38 as well as the front opening of the mounting structure 14. As with the diffuser 38, the material, color, translucency, or opaqueness of the lens 16 may vary from one embodiment to another. Further, both the diffuser 38 and the lens 16 may be formed from one or more materials or one or more layers of the same or different materials. While only one diffuser 38 and one lens 16 are depicted, the lighting fixture 10 may have multiple diffusers 38 or lenses 16.

For LED-based applications, the light source 34 provides an array of LEDs 50, as illustrated in FIG. 4. FIG. 4 illustrates a front isometric view of the lighting fixture 10, with the lens 16, diffuser 38, and reflector cone 36 removed, such that the light source 34 and the array of LEDs 50 are clearly visible within the mounting structure 14. FIG. 5 illustrates a front isometric view of the lighting fixture 10 with the lens 16 and diffuser 38 removed and the reflector cone 36 in place, such the array of LEDs 50 of the light source 34 are aligned with the rear opening of the reflector cone 36. As noted above, the volume inside the reflector cone 36 and bounded by the rear opening of the reflector cone 36 and the lens 16 or diffuser 38 provides a mixing chamber.

Figure 6:
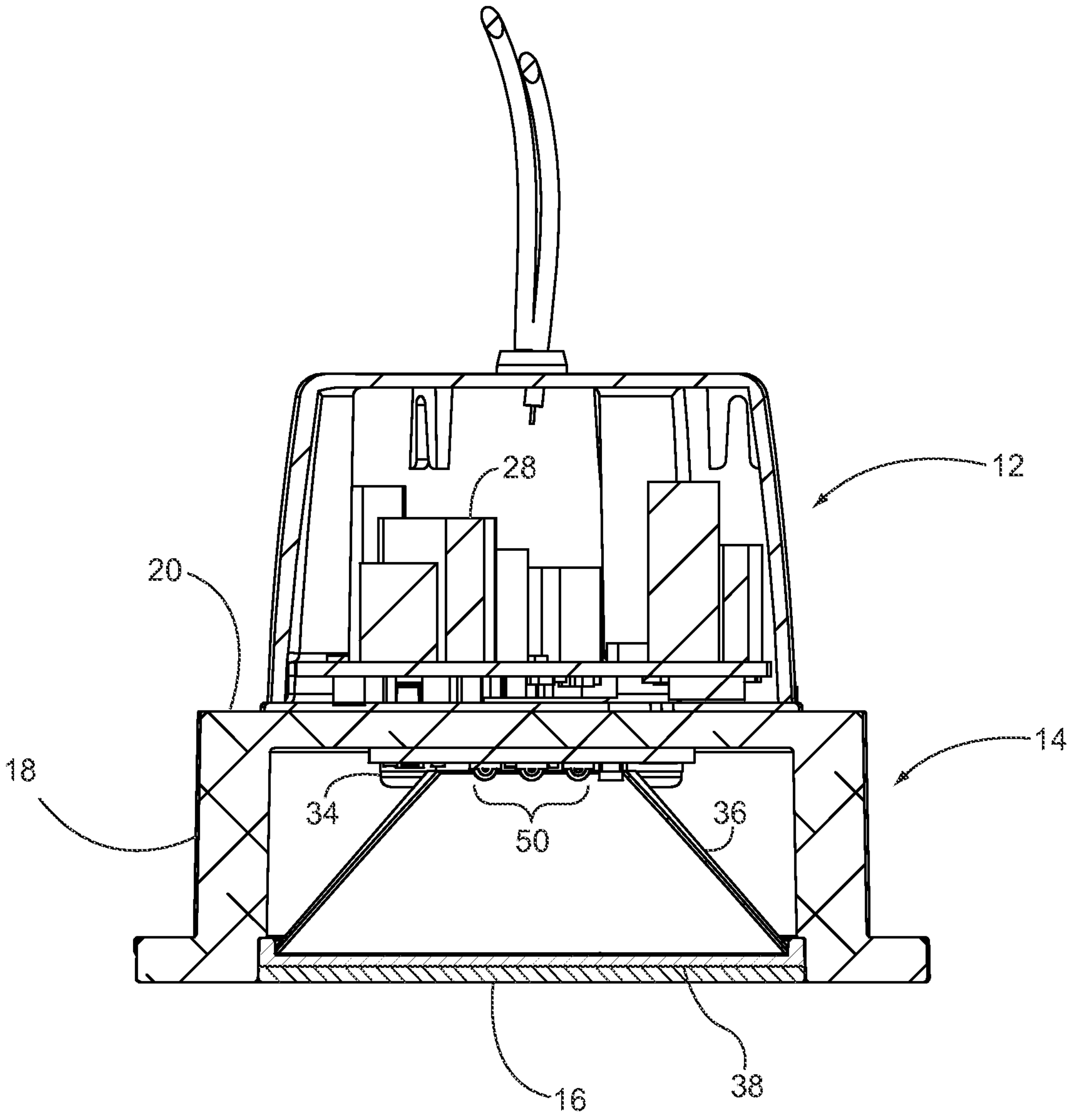
FIG. 6 is a cross sectional view of the lighting fixture of FIG. 5.

Light emitted from the array of LEDs 50 is mixed inside the mixing chamber formed by the reflector cone 36 (not shown) and directed out through the lens 16 in a forward direction to form a light beam. The array of LEDs 50 of the light source 34 may include LEDs 50 that emit different colors of light. For example, the array of LEDs 50 may include both red LEDs that emit reddish light and blue-shifted yellow (BSY) LEDs that emit bluish-yellow light or blue-shifted green (BSG) LEDs that emit bluish-green light, wherein the red and bluish-yellow or bluish-green light is mixed to form "white" light at a desired color temperature. In certain embodiments, the array of LEDs may include a large number of red LEDs and BSY or BSG LEDs in various ratios. For example, five or six BSY or BSG LEDs may surround each red LED, and the total number of LEDs may be 25, 50, 100, or more depending on the application. FIGS. 4, 5, and 6 only show 9 LEDs in the array of LEDs for clarity.

For a uniformly colored beam, relatively thorough mixing of the light emitted from the array of LEDs 50 is desired. Both the reflector cone 36 and the diffusion provided by the diffuser 38 play significant roles in mixing the light emanated from the array of LEDs 50 of the light source 34. In particular, certain light rays, which are referred to as non-reflected light rays, emanate from the array of LEDs 50 and exit the mixing chamber through the diffuser 38 and lens 16 without being reflected off of the interior surface of the reflector cone 36. Other light rays, which are referred to as reflected light rays, emanate from the array of LEDs 50 of the light source 34 and are reflected off of the front surface of the reflector cone 36 one or more times before exiting the mixing chamber through the diffuser 38 and lens 16. With these reflections, the reflected light rays are effectively mixed with each other and at least some of the non-reflected light rays within the mixing chamber before exiting the mixing chamber through the diffuser 38 and the lens 16.

As noted above, the diffuser 38 functions to diffuse, and as result mix, the non-reflected and reflected light rays as they exit the mixing chamber, wherein the mixing chamber and the diffuser 38 provide the desired mixing of the light emanated from the array of LEDs 50 of the light source 34 to provide a light beam of a consistent color. In addition to mixing light rays, the lens 16 and diffuser 38 may be designed and the reflector cone 36 shaped in a manner to control the relative concentration and shape of the resulting light beam that is projected from the lighting fixture 10. For example, a first lighting fixture 10 may be designed to provide a concentrated beam for a spotlight, wherein another may be designed to provide a widely dispersed beam for a floodlight. From an aesthetics perspective, the diffusion provided by the diffuser 38 also prevents the emitted light from looking pixelated and obstructs the ability for a user to see the individual LEDs of the array of LEDs 50.

As provided in the above embodiment, the more traditional approach to diffusion is to provide a diffuser 38 that is separate from the lens 16. As such, the lens 16 is effectively transparent and does not add any intentional diffusion. The intentional diffusion is provided by the diffuser 38. In most instances, the diffuser 38 and lens 16 are positioned next to one another as shown in FIG. 6. However, in other embodiments, the diffusion may be integrated into the lens 16 itself.

Figure 7:
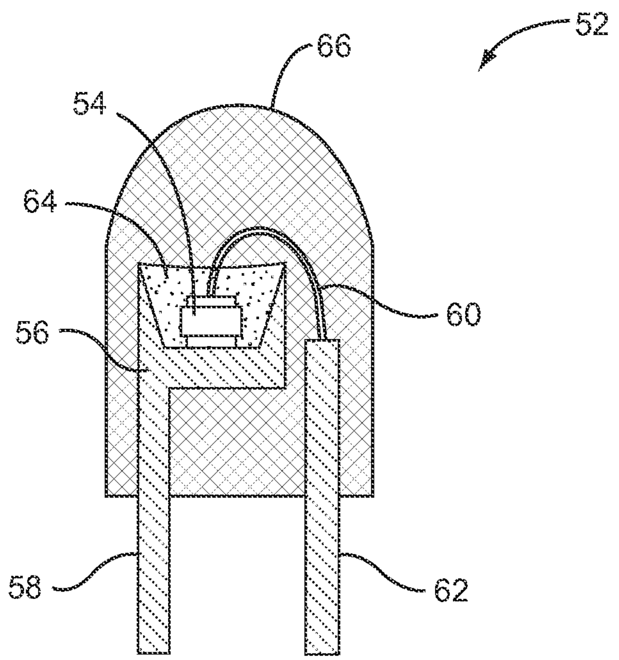
FIG. 7 is a cross-sectional view of a first type of LED architecture.

A traditional package for an LED 52 of the array of LEDs 50 is illustrated in FIG. 7. A single LED chip 54 is mounted on a reflective cup 56 using solder or a conductive epoxy, such that ohmic contacts for the cathode (or anode) of the LED chip 54 are electrically coupled to the bottom of the reflective cup 56. The reflective cup 56 is either coupled to or integrally formed with a first lead 58 of the LED 52. One or more bond wires 60 connect ohmic contacts for the anode (or cathode) of the LED chip 54 to a second lead 62.

The reflective cup 56 may be filled with an encapsulant material 64 that encapsulates the LED chip 54. The encapsulant material 64 may be clear or contain a wavelength conversion material, such as a phosphor, which is described in greater detail below. The entire assembly is encapsulated in a clear protective resin 66, which may be molded in the shape of a lens to control the light emitted from the LED chip 54.

Figure 8:
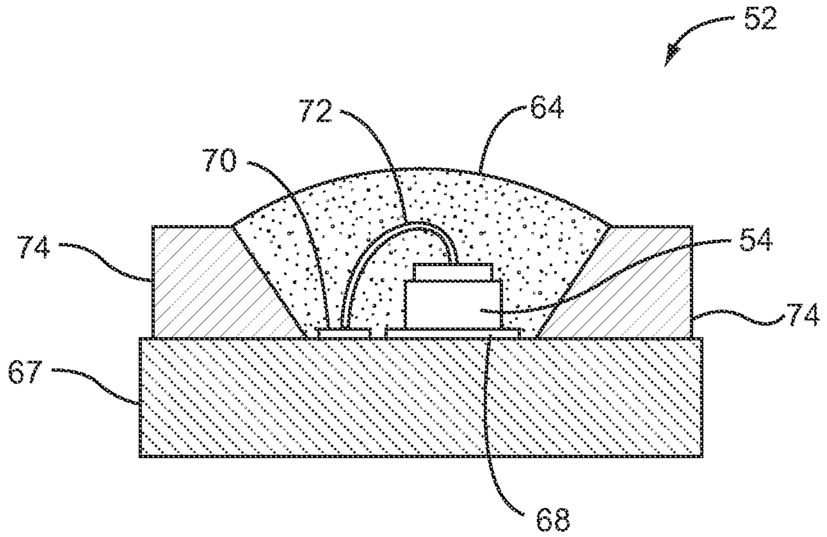
FIG. 8 is a cross-sectional view of a second type of LED architecture.

An alternative package for an LED 52 is illustrated in FIG. 8 wherein the LED chip 54 is mounted on a substrate 67. In particular, the ohmic contacts for the anode (or cathode) of the LED chip 54 are directly mounted to first contact pads 68 on the surface of the substrate 67. The ohmic contacts for the cathode (or anode) of the LED chip 54 are connected to second contact pads 70, which are also on the surface of the substrate 67, using bond wires 72. The LED chip 54 resides in a cavity of a reflector structure 74, which is formed from a reflective material and functions to reflect light emitted from the LED chip 54 through the opening formed by the reflector structure 74. The cavity formed by the reflector structure 74 may be filled with an encapsulant material 64 that encapsulates the LED chip 54. The encapsulant material 64 may be clear or contain a wavelength conversion material, such as a phosphor.

In either of the embodiments of FIGS. 7 and 8, if the encapsulant material 64 is clear, the light emitted by the LED chip 54 passes through the encapsulant material 64 and the protective resin 66 without any substantial shift in color. As such, the light emitted from the LED chip 54 is effectively the light emitted from the LED 52. If the encapsulant material 64 contains a wavelength conversion material, substantially all or a portion of the light emitted by the LED chip 54 in a first wavelength range may be absorbed by the wavelength conversion material, which will responsively emit light in a second wavelength range. The concentration and type of wavelength conversion material will dictate how much of the light emitted by the LED chip 54 is absorbed by the wavelength conversion material as well as the extent of the wavelength conversion. In embodiments where some of the light emitted by the LED chip 54 passes through the wavelength conversion material without being absorbed, the light passing through the wavelength conversion material will mix with the light emitted by the wavelength conversion material. Thus, when a wavelength conversion material is used, the light emitted from the LED 52 is shifted in color from the actual light emitted from the LED chip 54.

As noted above, the array of LEDs 50 may include a group of BSY or BSG LEDs 52 as well as a group of red LEDs 52. BSY LEDs 52 include an LED chip 54 that emits bluish light, and the wavelength conversion material is a yellow phosphor that absorbs the blue light and emits yellowish light. Even if some of the bluish light passes through the phosphor, the resultant mix of light emitted from the overall BSY LED 52 is yellowish light. The yellowish light emitted from a BSY LED 52 has a color point that falls above the Black Body Locus (BBL) on the 1931 CIE chromaticity diagram wherein the BBL corresponds to the various color temperatures of white light.

Similarly, BSG LEDs 52 include an LED chip 54 that emits bluish light; however, the wavelength conversion material is a greenish phosphor that absorbs the blue light and emits greenish light. Even if some of the bluish light passes through the phosphor, the resultant mix of light emitted from the overall BSG LED 52 is greenish light. The greenish light emitted from a BSG LED 52 has a color point that falls above the BBL on the 1931 CIE chromaticity diagram wherein the BBL corresponds to the various color temperatures of white light.

The red LEDs 52 generally emit reddish light at a color point on the opposite side of the BBL as the yellowish or greenish light of the BSY or BSG LEDs 52. As such, the reddish light from the red LEDs 52 mixes with the yellowish or greenish light emitted from the BSY or BSG LEDs 52 to generate white light that has a desired color temperature and falls within a desired proximity of the BBL. In effect, the reddish light from the red LEDs 52 pulls the yellowish or greenish light from the BSY or BSG LEDs 52 to a desired color point on or near the BBL. Notably, the red LEDs 52 may have LED chips 54 that natively emit reddish light wherein no wavelength conversion material is employed. Alternatively, the LED chips 54 may be associated with a wavelength conversion material, wherein the resultant light emitted from the wavelength conversion material and any light that is emitted from the LED chips 54 without being absorbed by the wavelength conversion material mixes to form the desired reddish light.

The blue LED chip 54 used to form either the BSY or BSG LEDs 52 may be formed from a gallium nitride (GaN), indium gallium nitride (InGaN), silicon carbide (SiC), zinc selenide (ZnSe), or like material system. The red LED chip 54 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 9:
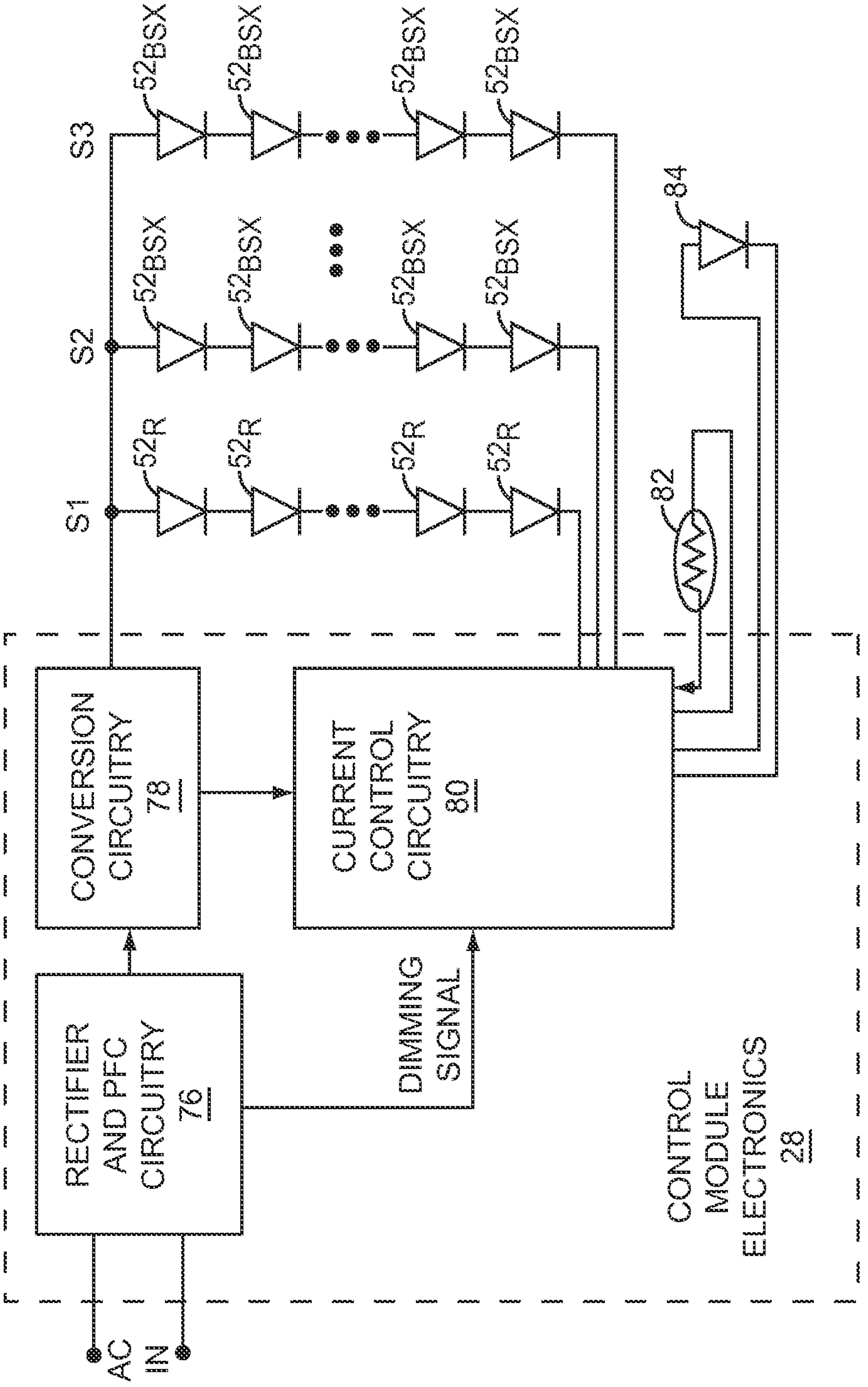
FIG. 9 is a schematic of the exemplary control module electronics according to one embodiment of the disclosure.

As noted, the array of LEDs 50 may include a mixture of red LEDs 52 and either BSY or BSG LEDs 52. The control module electronics 28 for driving the array of LEDs 50 is illustrated in FIG. 9 according to one embodiment of the disclosure. The array of LEDs 50 is electrically divided into two or more strings of series connected LEDs 52. As depicted, there are three LED strings S1, S2, and S3. For clarity, the reference number "52" will include a subscript indicative of the color of the LED 52 in the following text where 'R' corresponds to red, BSY corresponds to blue shifted yellow, BSG corresponds to blue shifted green, and BSX corresponds to either BSG or BSY LEDs. LED string 51 includes a number of red LEDs $\mathbf{52}_R$, LED string S2 includes a number of either BSY or BSG LEDs $\mathbf{52}_{BSX}$, and LED string S3 includes a number of either BSY or BSG LEDs $\mathbf{52}_{BSX}$. The control module electronics 28 control the current delivered to the respective LED strings S1, S2, and S3. The current used to drive the LEDs 52 is generally pulse width modulated (PWM), wherein the duty cycle of the pulsed current controls the intensity of the light emitted from the LEDs 52.

The BSY or BSG LEDs $\mathbf{52}_{BSX}$ in the second LED string S2 may be selected to have a slightly more bluish hue (less yellowish or greenish hue) than the BSY or BSG LEDs $\mathbf{52}_{BSX}$ in the third LED string S3. As such, the current flowing through the second and third strings S2 and S3 may be tuned to control the yellowish or greenish light that is effectively emitted by the BSY or BSG LEDs $\mathbf{52}_{BSX}$ of the second and third LED strings S2, S3. By controlling the relative intensities of the yellowish or greenish light emitted from the differently hued BSY or BSG LEDs $\mathbf{52}_{BSX}$ of the second and third LED strings S2, S3, the hue of the combined yellowish or greenish light from the second and third LED strings S2, S3 may be controlled in a desired fashion.

The ratio of current provided through the red LEDs $\mathbf{52}_R$ of the first LED string S1 relative to the currents provided through the BSY or BSG LEDs $\mathbf{52}_{BSX}$ of the second and third LED strings S2 and S3 may be adjusted to effectively control the relative intensities of the reddish light emitted from the red LEDs $\mathbf{52}_R$ and the combined yellowish or greenish light emitted from the various BSY or BSG LEDs $\mathbf{52}_{BSX}$. As such, the intensity and the color point of the yellowish or greenish light from BSY or BSG LEDs $\mathbf{52}_{BSX}$ can be set relative the intensity of the reddish light emitted from the red LEDs $\mathbf{52}_R$. The resultant yellowish or greenish light mixes with the reddish light to generate white light that has a desired color temperature and fails within a desired proximity of the BBL.

The control module electronics 28 depicted in FIG. 9 generally include rectifier and power factor correction (PFC) circuitry 76, conversion circuitry 78, and current control circuitry 80. The rectifier and power factor correction circuitry 76 is adapted to receive an AC power signal (AC IN), rectify the AC power signal, and correct the power factor of the AC power signal. The resultant signal is provided to the conversion circuitry 78, which converts the rectified AC power signal to a DC signal. The DC signal may be boosted or bucked to one or more desired DC voltages by DC-DC converter circuitry, which is provided by the conversion circuitry 78. A DC voltage is provided to the first end of each of the LED strings S1, S2, and S3. The same or different DC voltage is also provided to the current control circuitry 80.

The current control circuitry 80 is coupled to the second end of each of the LED strings S1, S2, and S3. Based on any number of fixed or dynamic parameters, the current control circuitry 80 may individually control the pulse width modulated current that flows through the respective LED strings S1, S2, and S3 such that the resultant white light emitted from the LED strings S1, S2, and S3 has a desired color temperature and fails within a desired proximity of the BBL. Certain of the many variables that may impact the current provided to each of the LED strings S1, S2, and S3 include: the magnitude of the AC power signal, the resultant white light, ambient temperature of the control module electronics 28 or array of LEDs 50.

In certain instances, a dimming device provides the AC power signal. The rectifier and PFC circuitry 76 may be configured to detect the relative amount of dimming associated with the AC power signal and provide a corresponding dimming signal to the current control circuitry 80. Based on the dimming signal, the current control circuitry 80 will adjust the current provided to each of the LED strings S1, S2, and S3 to effectively reduce the intensity of the resultant white light emitted from the LED strings S1, S2, and S3 while maintaining the desired color temperature.

The intensity or color of the light emitted from the LEDs 52 may be affected by ambient temperature. If associated with a thermistor 82 or other temperature sensing device, the current control circuitry 80 can control the current provided to each of the LED strings S1, S2, and S3 based on ambient temperature in an effort to compensate for adverse temperature effects. The intensity or color of the light emitted from the LEDs 52 may also change over time. If associated with an optical sensor 84, the current control circuitry 80 can measure the color of the resultant white light being generated by the LED strings S1, S2, and S3 and adjust the current provided to each of the LED strings S1, S2, and S3 to ensure that the resultant white light maintains a desired color temperature.

As noted above, the CRI is the current standard for measuring the ability of a lighting source to accurately render colors, and the CRI is somewhat limited in being able to measure how well solid-state lighting sources render colors or to provide a reliable metric for overall color quality. Given the limitations of the CRI to measure color quality for solid-state lighting sources, the CQS has been developed by NIST to address the limitation of CRI as well as provide a more reliable metric for determining color quality for solid-state lighting sources. The following describes numerous configurations for LED-based lighting sources that provide high quality white light wherein certain of the configurations provide white light that has a relatively high CQS measurement regardless of the CRI $R_a$, a relatively high CQS measurement and a relatively high CRI $R_a$, and a relatively high CQS measurement and a relatively low CRI $R_a$.

FIGS. 10A and 10B through FIGS. 14A and 14B provide diagrams that illustrate the differences in CQS and CRI measurements for various solid-state lighting configurations. FIGS. 10A and 10B through FIGS. 13A and 13B illustrate the differences in CQS and CRI at various color temperatures for a solid-state lighting configuration that employs BSY LEDs $\mathbf{52}_{BSY}$ and red LEDs $\mathbf{52}_R$ wherein the yellowish light emitted from the various BSY LEDs $\mathbf{52}_{BSY}$ mixes with the reddish light from the red LEDs $\mathbf{52}_R$ to provide white light at a desired color temperature. In particular, FIGS. 10A and 10B respectively correspond to CQS and CRI measurements for white light at 2700K; FIGS. 11A and 11B respectively correspond to CQS and CRI measurements for white light at 3500K; FIGS. 12A and 12B respectively correspond to CQS and CRI measurements for white light at 4500K; and FIGS. 13A and 13B respectively correspond to CQS and CRI measurements for white light at 5000K.

In each of FIGS. 10A and 10B through FIGS. 14A and 14B, the x-axis represents the dominant wavelength of reddish light emitted by the red LEDs $\mathbf{52}_R$ while the y-axis represents the peak wavelength of the blue excitation light emitted by the blue LED chips 54 of the BSY LEDs $\mathbf{52}_{BSY}$. As noted above, the blue light of the LED chips 54 excites the yellow phosphors of the BSY LEDs $\mathbf{52}_{BSY}$. The yellow phosphors in this example are YAG:Ce phosphors. The light emitted from the yellow phosphors, along with any of the blue light that escapes through the phosphors, represent the yellowish light emitted from the BSY LEDs $\mathbf{52}_{BSY}$.

Figure 10A:
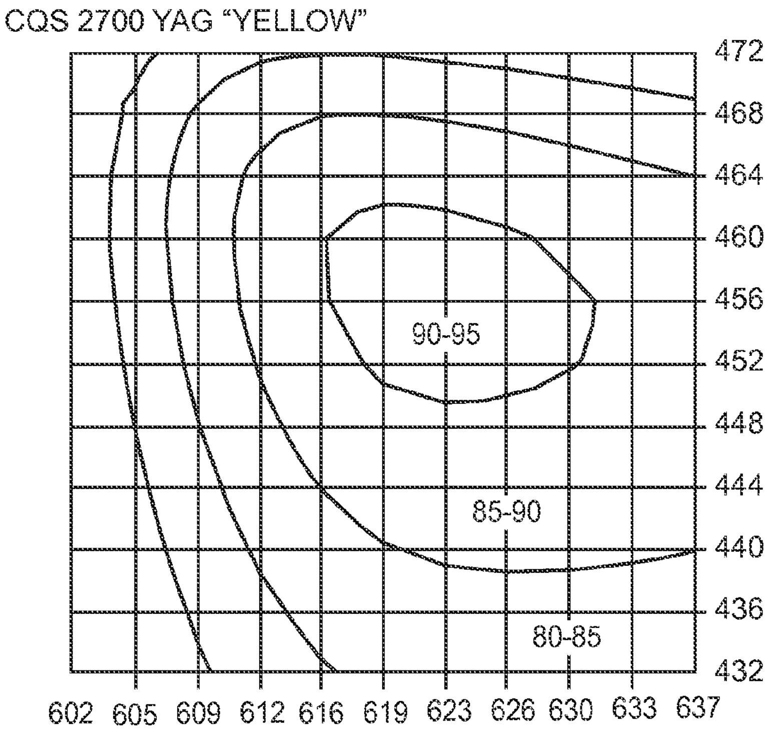
FIGS. 10A and 10B are respective CQS and CRI diagrams illustrating the difference in corresponding CQS measurements and CRI $R_a$ measurements for a first exemplary configuration of a lighting device of the present disclosure.
Figure 10B:
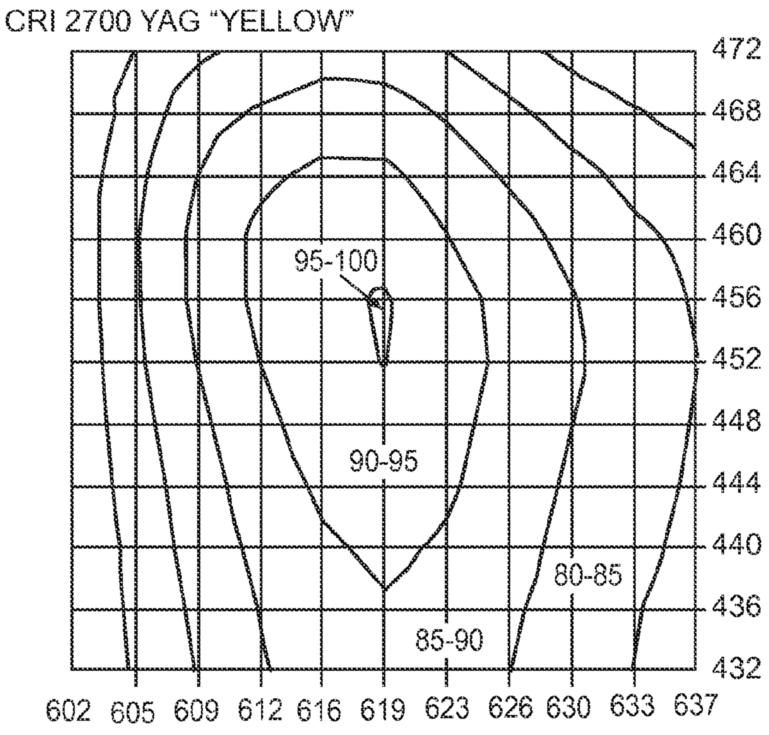
Figure 11A:
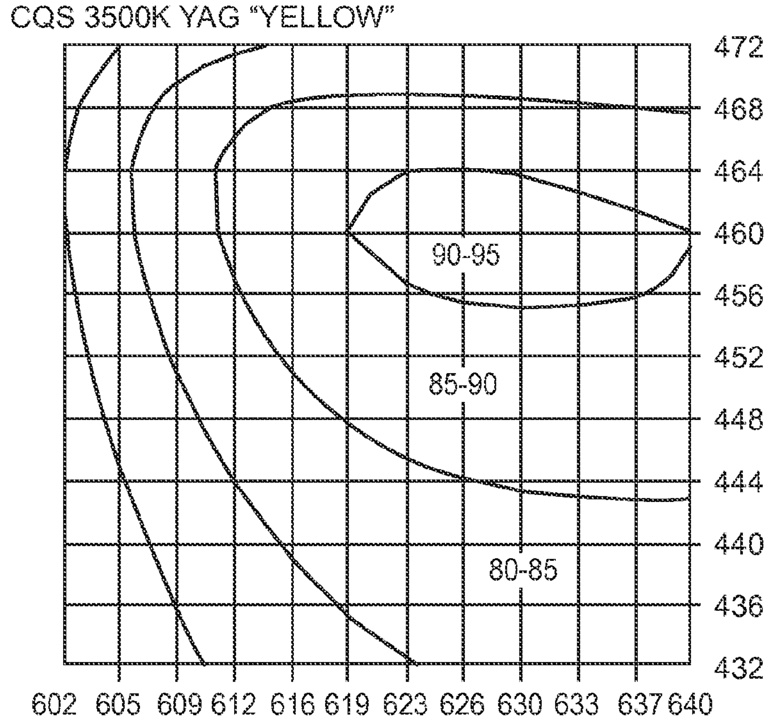
FIGS. 11A and 11B are respective CQS and CRI diagrams illustrating the difference in corresponding CQS measurements and CRI $R_a$ measurements for a second exemplary configuration of a lighting device of the present disclosure.
Figure 11B:
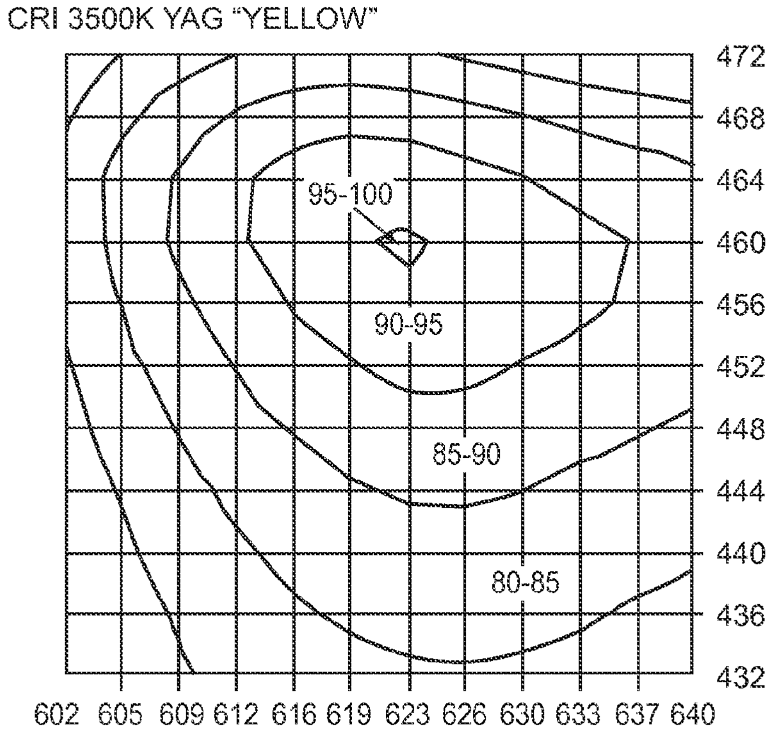
Figure 12A:
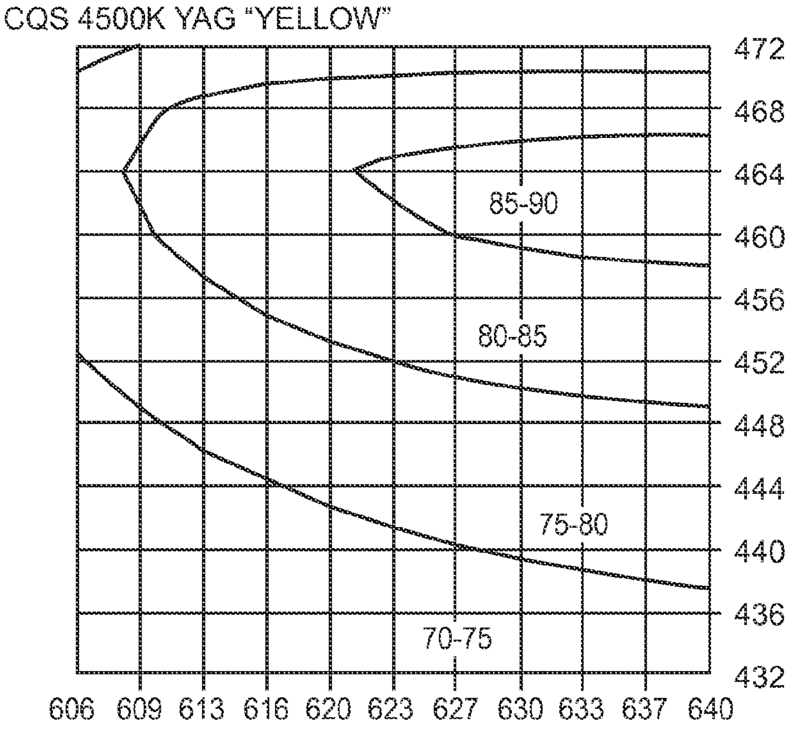
FIGS. 12A and 12B are respective CQS and CRI diagrams illustrating the difference in corresponding CQS measurements and CRI $R_a$ measurements for a third exemplary configuration of a lighting device of the present disclosure.
Figure 12B:
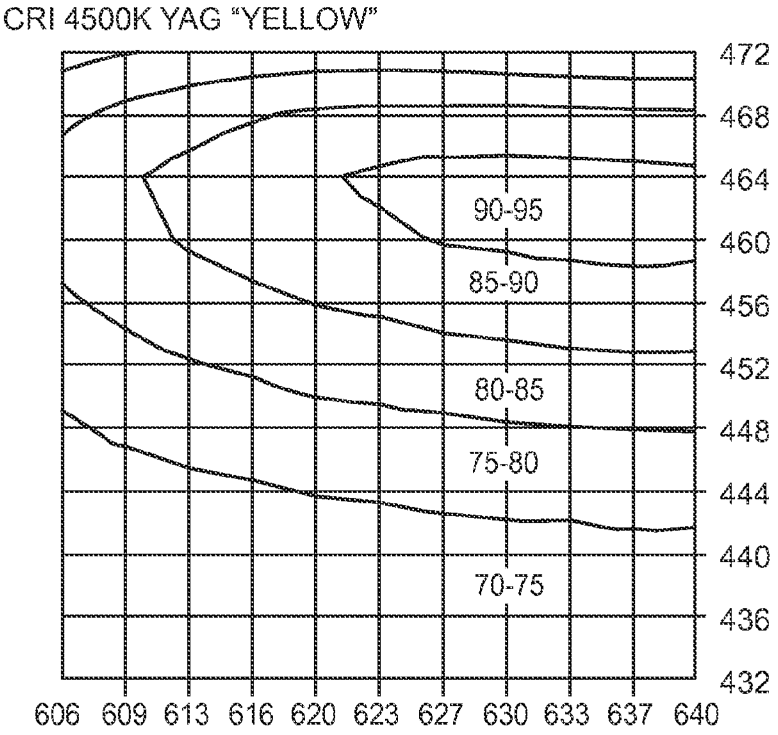
Figure 13A:
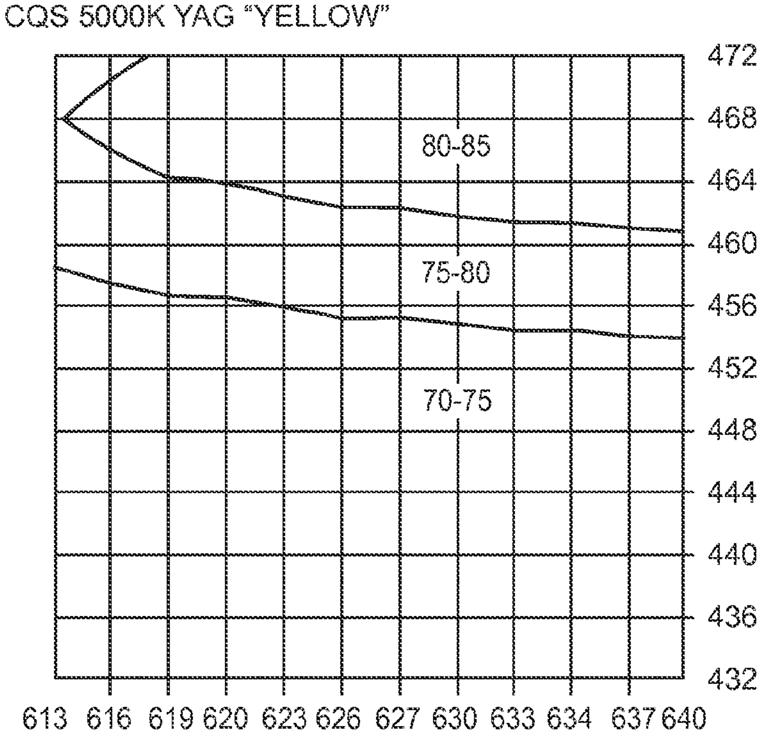
FIGS. 13A and 13B are respective CQS and CRI diagrams illustrating the difference in corresponding CQS measurements and CRI $R_a$ measurements for a forth exemplary configuration of a lighting device of the present disclosure.
Figure 13B:
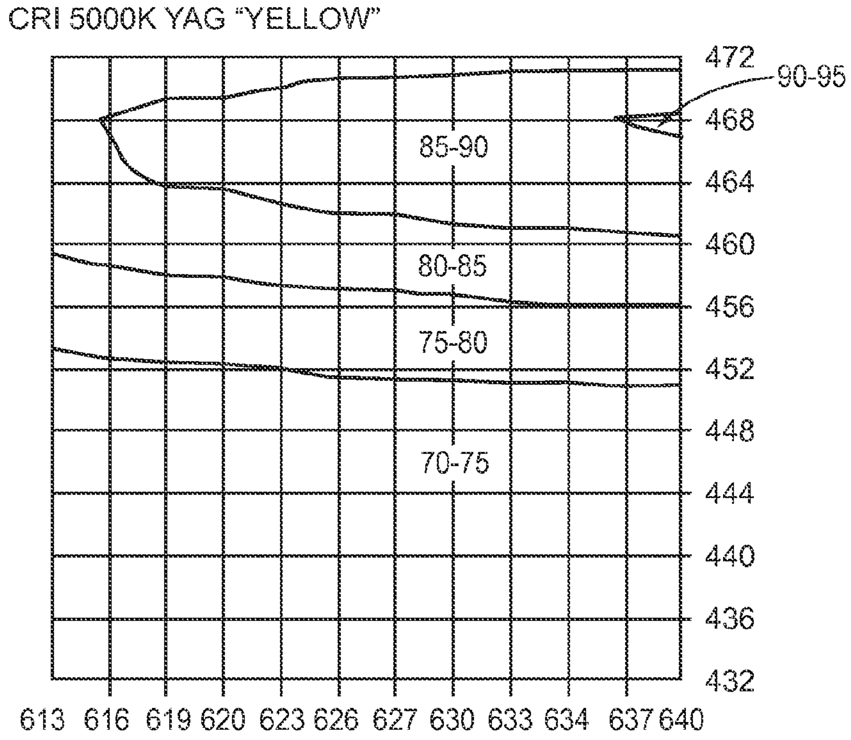

Comparing the CQS and CRI measurements in FIGS. 10A and 10B, one can readily see a significant variance in CQS and CRI measurements for each of the ranges 80-85, 85-90, and 90-95. For example, the area representing CQS measurements of 90-95 is much smaller, shaped differently, and shifted higher in the reddish light spectrum than the corresponding area representing CRI measurements of 90-95. In this particular example, the range of peak wavelengths for the blue excitation light that provides CQS measurements in each of the respective ranges is less than what is necessary to provide corresponding CRI measurements. For instance, a peak wavelength of blue excitation light as low as 438 nm can be used with reddish light having the appropriate dominant wavelength (i.e. 619 nm) to achieve a CRI measurement of 90 or greater. In contrast, the lowest peak wavelength of blue excitation light to provide a CQS measurement greater than 90 is around 450 nm. Similar differences occur in each of the ranges for the different color temperatures for each of the various examples in FIGS. 10A and 10B through FIGS. 13A and 13B, which employ yellow phosphors.

Figure 14A:
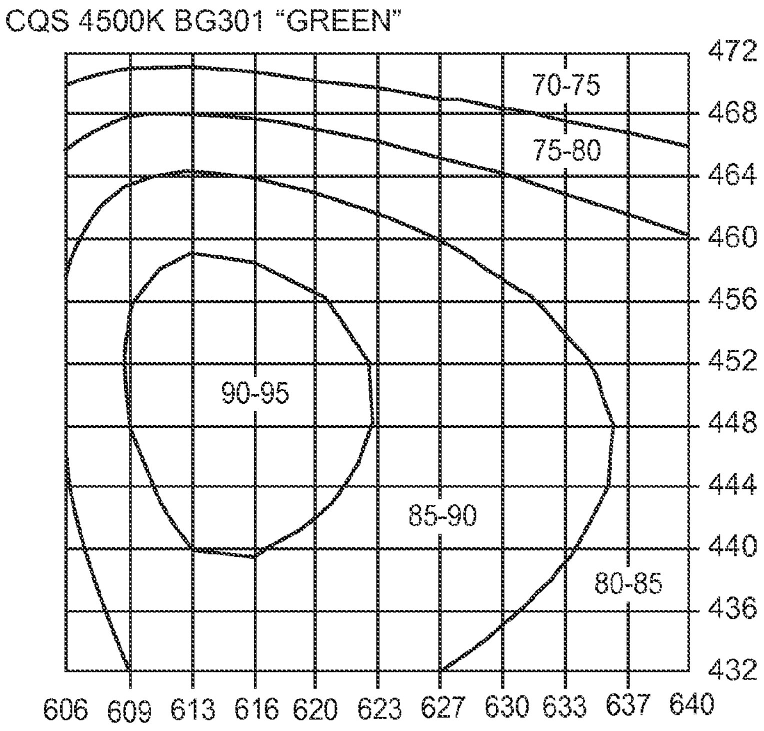
FIGS. 14A and 14B are respective CQS and CRI diagrams illustrating the difference in corresponding CQS measurements and CRI $R_a$ measurements for a fifth exemplary configuration of a lighting device of the present disclosure.
Figure 14B:
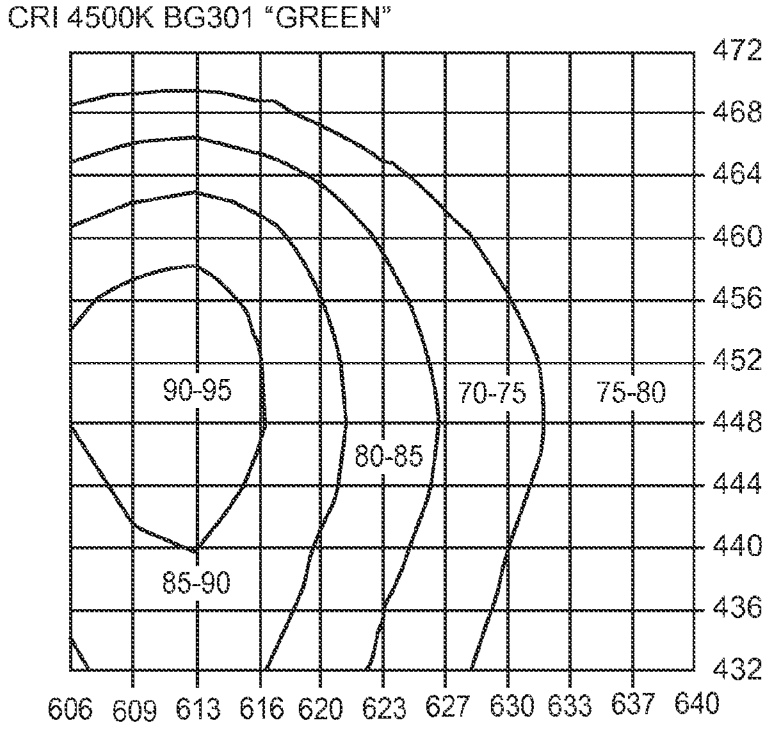
Figure 15A:
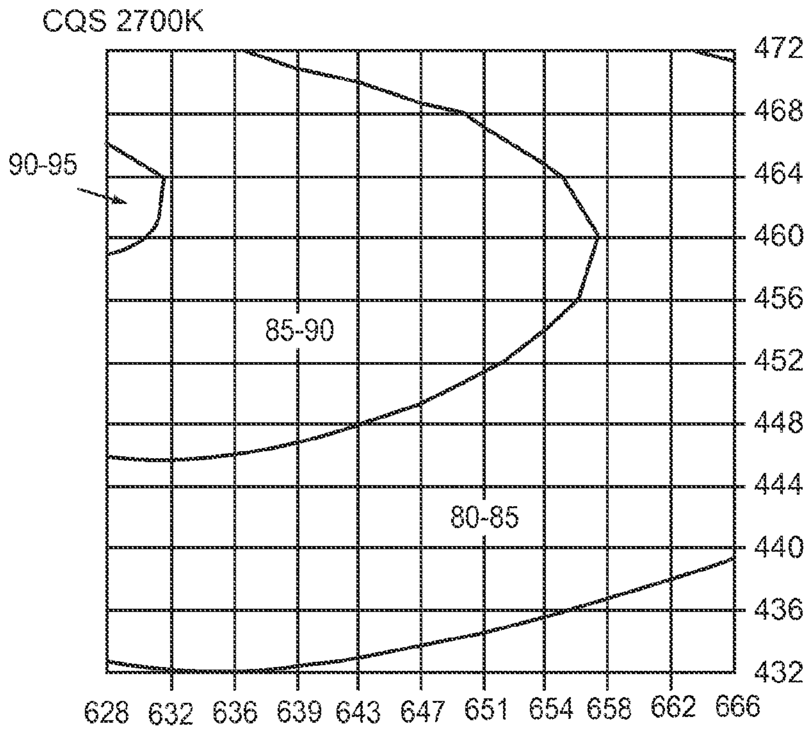
FIGS. 15A through 15E are diagrams illustrating the difference in corresponding CQS measurements at different color temperatures for an exemplary configuration of a lighting device of the present disclosure.
Figure 15B:
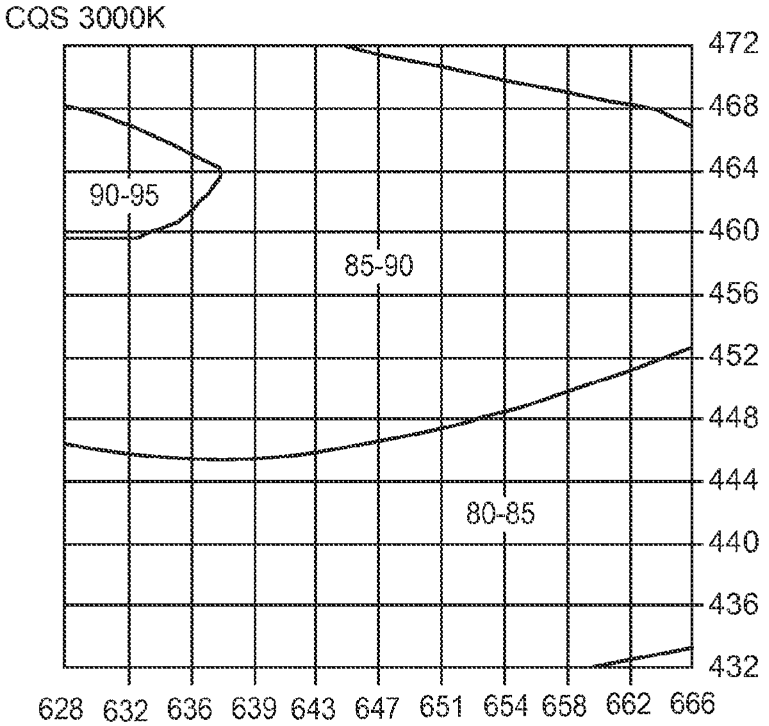
Figure 15C:
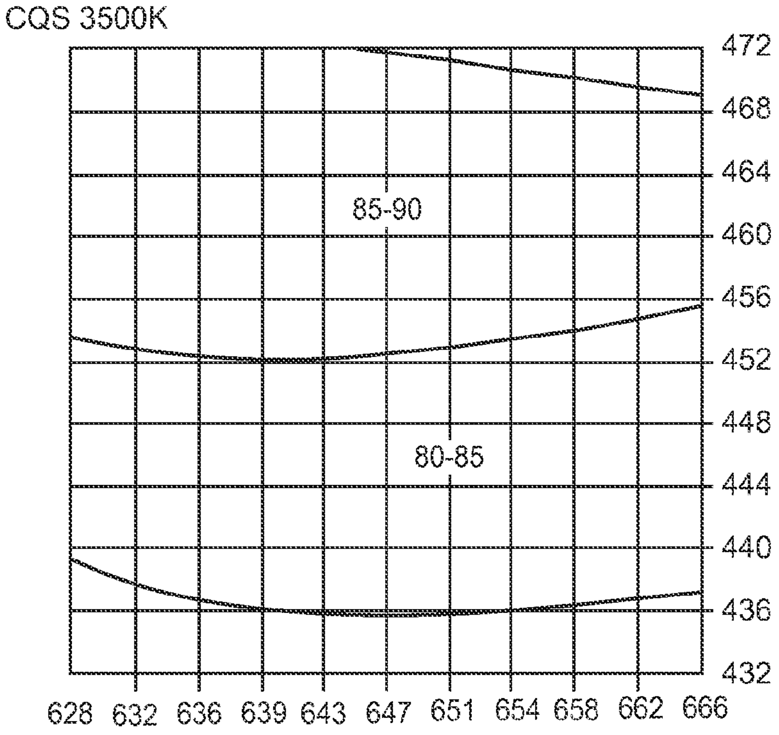
Figure 15D:
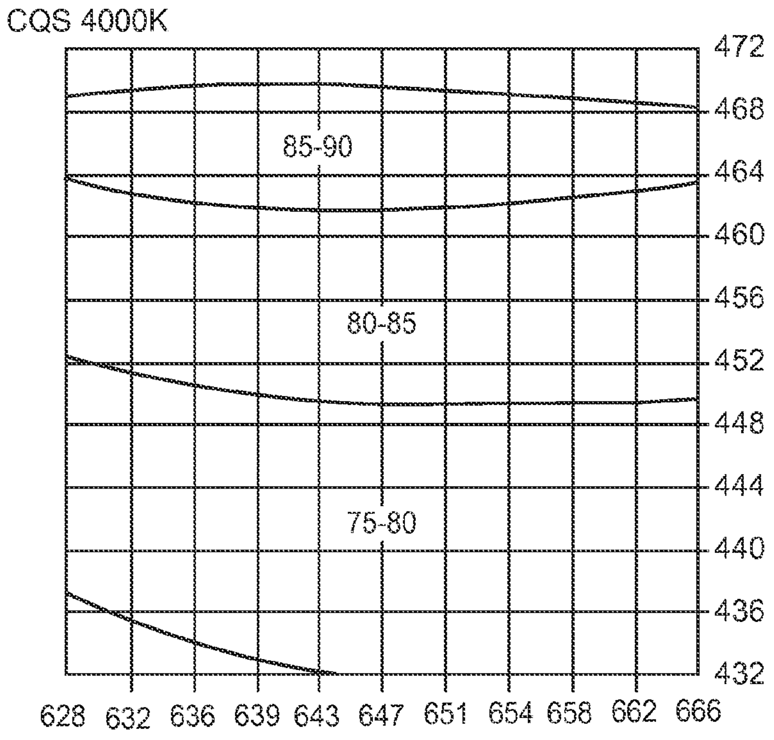
Figure 15E:
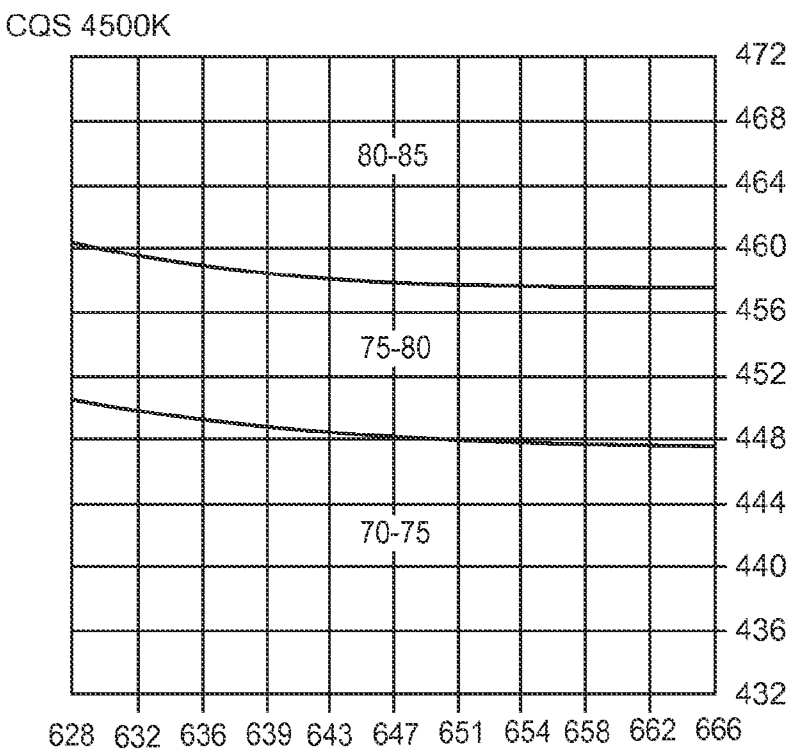

The same phenomena occur with green phosphors, as illustrated in FIGS. 14A and 14B. In this embodiment, BSG LEDs $\mathbf{52}_{BSG}$ are employed instead of BSY LEDs $\mathbf{52}_{BSY}$ to generate white light at 4500K. As such, the x-axis represents the dominant wavelength of reddish light emitted by the red LEDs $\mathbf{52}_R$ while the y-axis represents the peak wavelength of the blue excitation light emitted by the blue LED chips 54 of the BSG LEDs $\mathbf{52}_{BSG}$. The blue light of the LED chips 54 excites the green phosphors of the BSG LEDs $\mathbf{52}_{BSG}$. The green phosphors in this example are BG301 phosphors. The light emitted from the green phosphors, along with any of the blue light that escapes through the phosphors, represent the greenish light emitted from the BSG LEDs $\mathbf{52}_{BSG}$.

Comparing the CQS and CRI measurements in FIGS. 14A and 14B, one can readily see a significant variance in CQS and CRI measurements for each of the ranges 70-75, 75-80, 80-85, 85-90, and 90-95. For example, the area representing CQS measurements of 90-95 is actually somewhat larger and shifted significantly higher in the reddish light spectrum than the corresponding area representing CRI measurements of 90-95. In this particular example, the range of peak wavelengths for the blue excitation light that provides CQS measurements in each of the respective ranges is similar to what is necessary to provide corresponding CRI measurements.

With reference to FIGS. 15A through 15E diagrams for CQS measurements are provided for white light at 2700K, 3000K, 3500K, 4000K, and 4500K. In this example, BSY LEDs $\mathbf{52}_{BSY}$ and red LEDs $\mathbf{52}_R$ are employed wherein the yellowish light emitted from the various BSY LEDs $\mathbf{52}_{BSY}$ mixes with the reddish light from the red LEDs $\mathbf{52}_R$ to provide white light at the respective color temperatures. For each CQS diagram, the x-axis represents the dominant wavelength of reddish light emitted by the red LEDs $\mathbf{52}_R$ while the y-axis represents the peak wavelength of the blue excitation light emitted by the blue LED chips 54 of the BSY LEDs $\mathbf{52}_{BSY}$. In this example, the dominant wavelengths for the reddish light emitted from the red LEDs $\mathbf{52}_R$ are longer than in the prior examples, and thus the reddish light is pushed higher into the red spectrum. Note that the x-axis extends from 628 nm to 666 nm, and the yellow phosphor employed by the BSY LEDs $\mathbf{52}_{BSY}$ is BOSE or YAG:Ce. As clearly illustrated in each of FIGS. 15A through 15E, excellent CQS measurements are possible even with higher-wavelength reddish light.

The following outlines a variety of configurations that are designed to generate relatively high CQS measurements using various combinations of BSY or BSG LEDs $\mathbf{52}_{BSX}$ and red LEDs $\mathbf{52}_R$. In select configurations, the resultant yellowish or greenish light, including any bluish light that passes through any associated phosphor and mixes with the light emitted from the phosphor that is emitted by the BSY or BSG LEDs $\mathbf{52}_{BSX}$ is defined as falling within one of four specified color spaces on the 1931 CIE chromaticity diagram. The boundary of each color space is defined by a series of line segments that connect a set of points on the 1931 CIE chromaticity diagram. A corresponding x, y coordinate identifies each point. Color points falling on or within these line segments are considered to fall within the defined color space.

Figure 16:
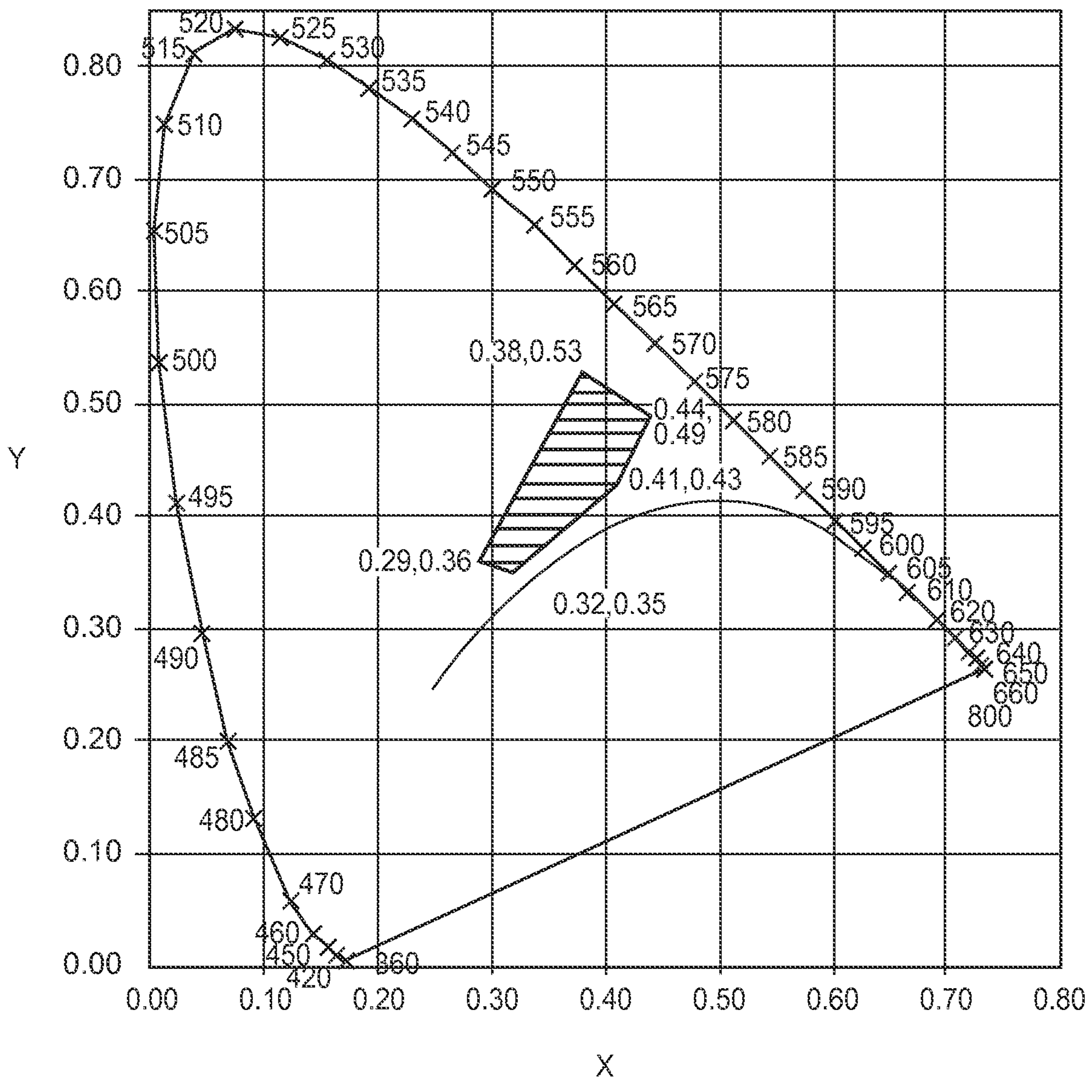
FIG. 16 is a 1931 CIE chromaticity diagram illustrating a first BSY LED color space.

As illustrated in FIG. 16, the first exemplary color space for BSY LEDs $\mathbf{52}_{BSY}$ is referred to herein as "the large BSY color space" and is defined by the set of points:

[(0.29, 0.36) (0.38, 0.53) (0.44, 0.49) (0.41, 0.43) (0.32, 0.35)].

The large BSY color space falls above the BBL and is represented by the hashed area on the 1931 CIE chromaticity diagram.

Figure 17:
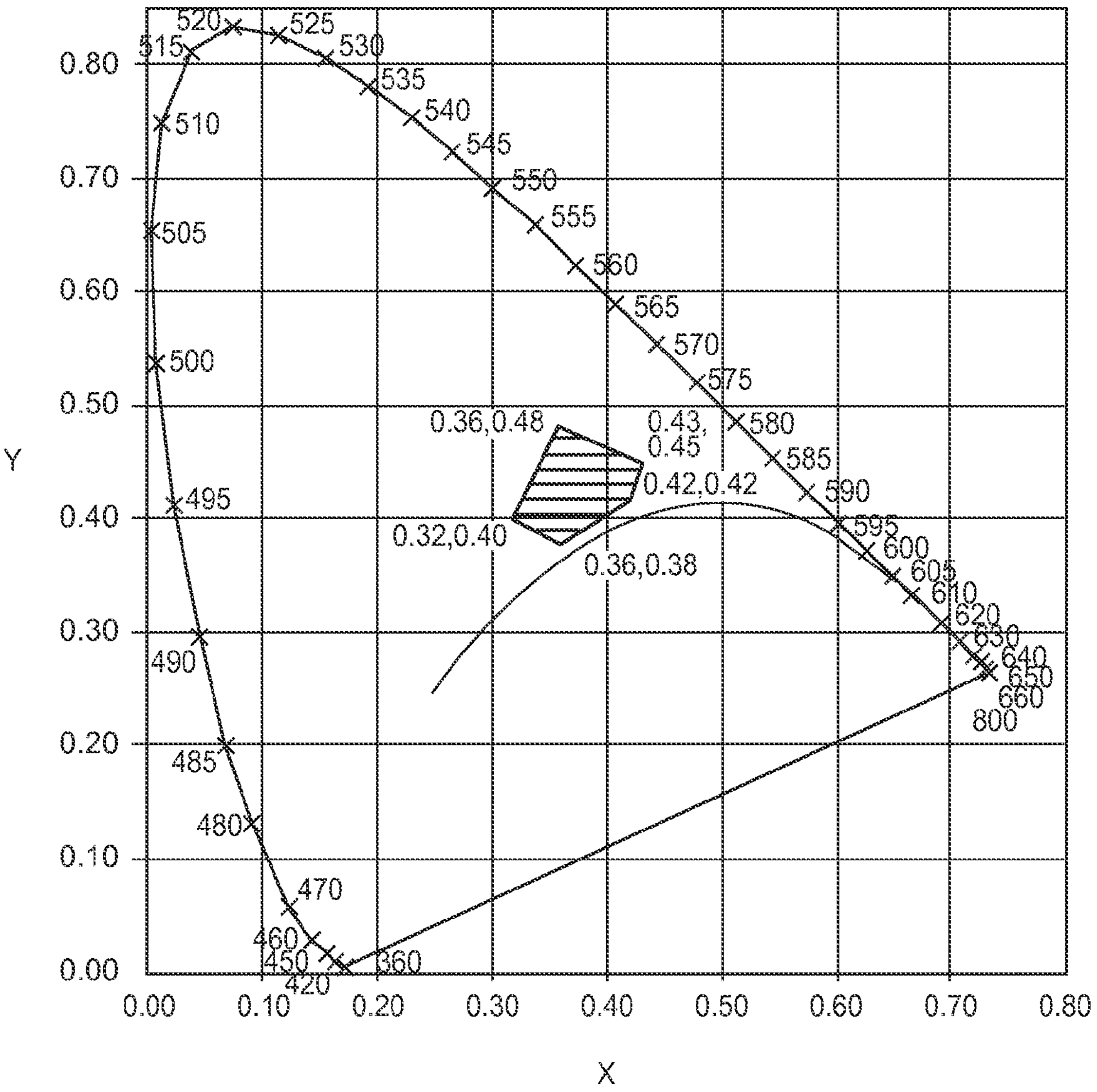
FIG. 17 is a 1931 CIE chromaticity diagram illustrating a second BSY LED color space.

As illustrated in FIG. 17, the second exemplary color space for BSY LEDs $\mathbf{52}_{BSY}$ is referred to herein as "the small BSY color space" and is defined by the set of points:

[(0.32, 0.40) (0.36, 0.48) (0.43, 0.45) (0.42, 0.42) (0.36, 0.38)].

The small BSY color space falls above the BBL and is represented by the hashed area on the 1931 CIE chromaticity diagram.

Figure 18:
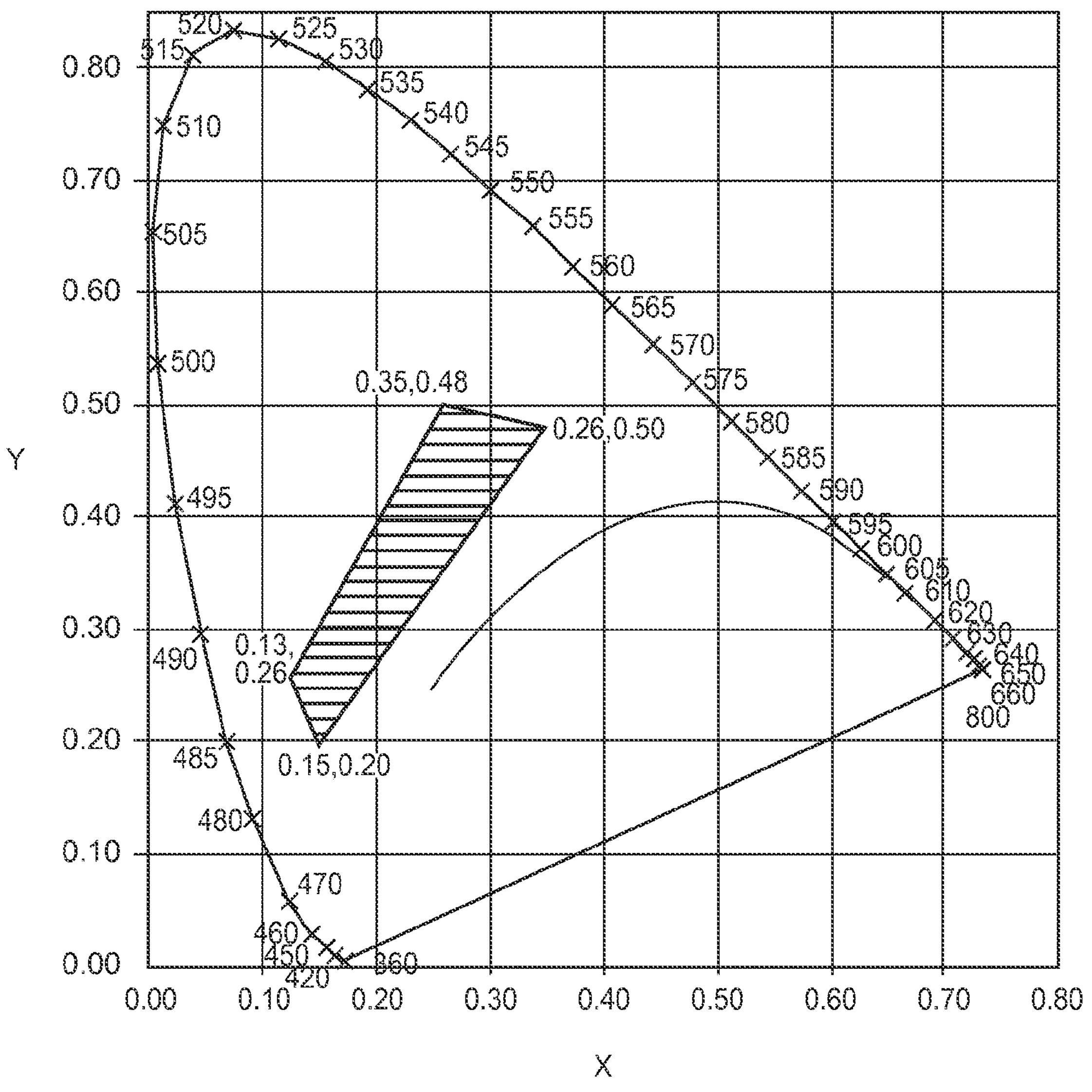
FIG. 18 is a 1931 CIE chromaticity diagram illustrating a first BSG LED color space.

As illustrated in FIG. 18, the first exemplary color space for BSG LEDs $\mathbf{52}_{BSG}$ is referred to herein as "the large BSG color space" and is defined by the set of points:

[(0.13, 0.26) (0.35, 0.48) (0.26, 0.50) (0.15, 0.20)].

The large BSG color space falls above the BBL and is represented by the hashed area on the 1931 CIE chromaticity diagram.

Figure 19:
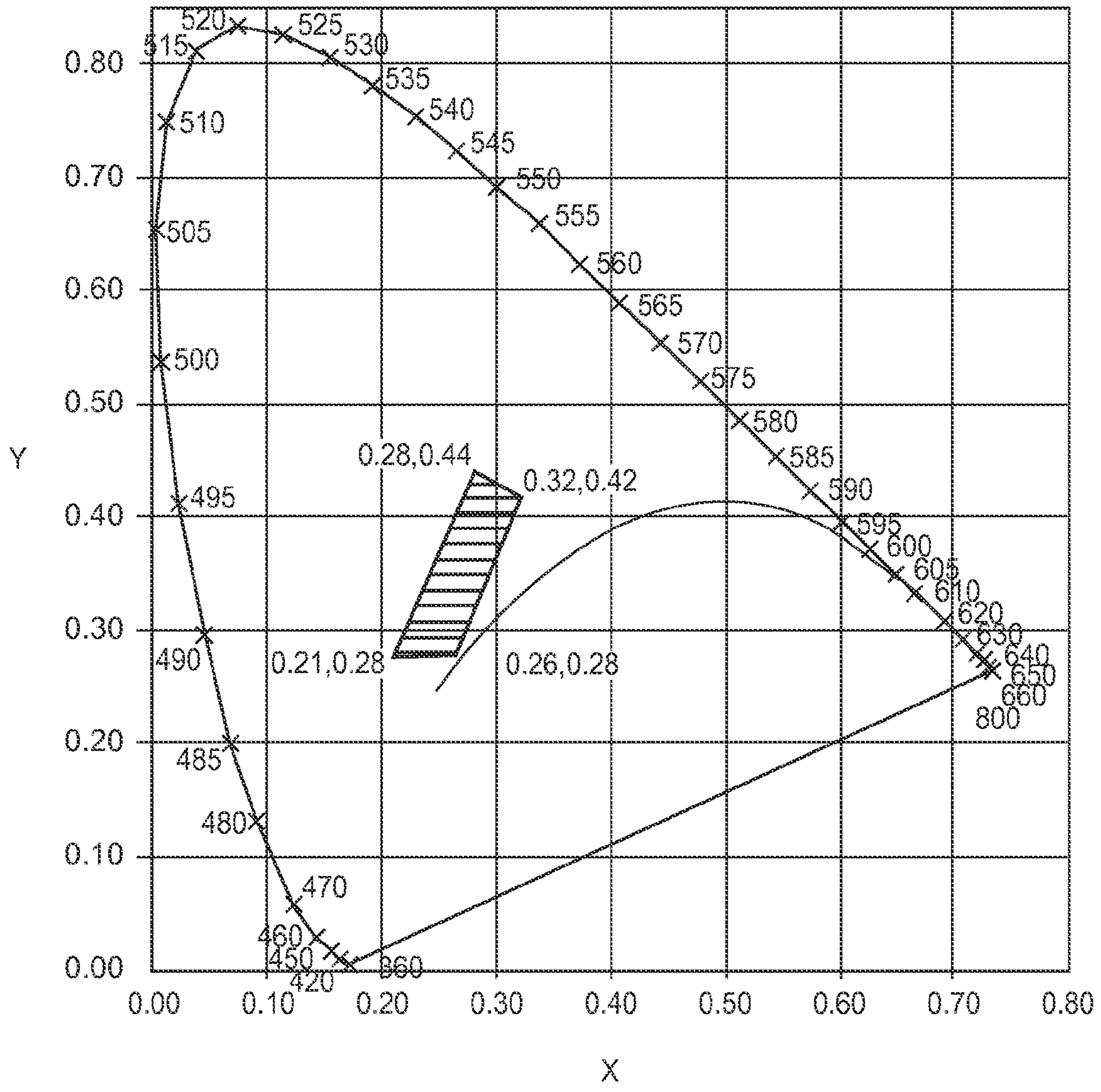
FIG. 19 is a 1931 CIE chromaticity diagram illustrating a second BSG LED color space.
Figure 20:
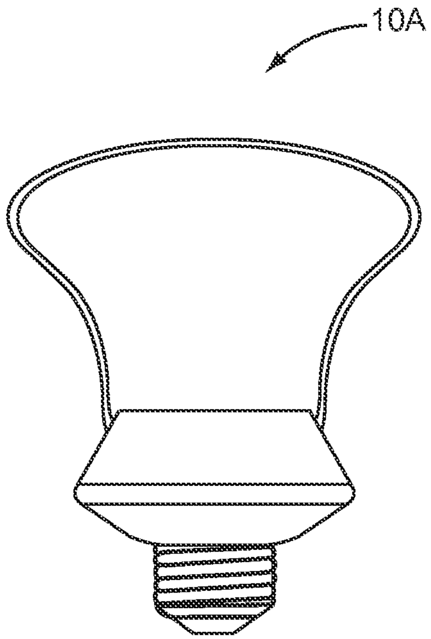
FIG. 20 is a second embodiment of a lighting fixture according to the present disclosure.
Figure 21:
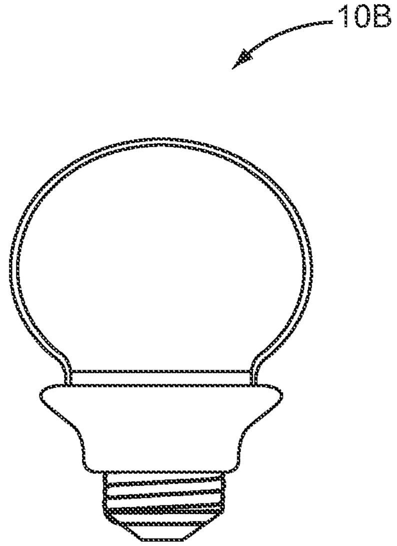
FIG. 21 is a third embodiment of a lighting fixture according to the present disclosure.
Figure 22:
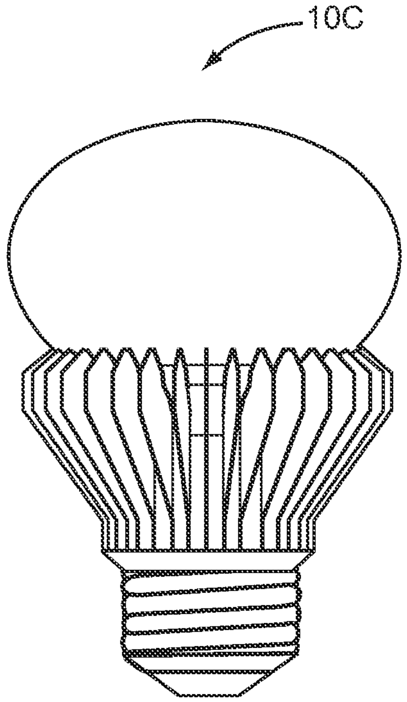
FIG. 22 is a fourth embodiment of a lighting fixture according to the present disclosure.
Figure 23:
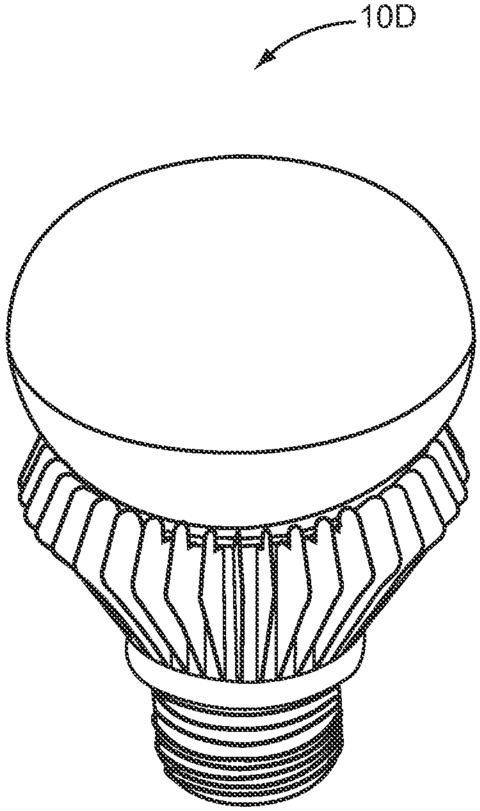
FIG. 23 is a fifth embodiment of a lighting fixture according to the present disclosure.

As illustrated in FIG. 19, the second exemplary color space for BSG LEDs $\mathbf{52}_{BSG}$ is referred to herein as "the small BSG color space" and is defined by the set of points:

[(0.21, 0.28) (0.28, 0.44) (0.32, 0.42) (0.26, 0.28)].

The small BSG color space falls above the BBL and is represented by the hashed area on the 1931 CIE chromaticity diagram.

The first configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 410 to 490 nm; the dominant wavelength of the yellow phosphor associated with the BSY LEDs $\mathbf{52}_{BSY}$ is 535 to 590 nm; and the dominant wavelength of the red LEDs $\mathbf{52}_{R}$ is 631 to 700 nm. The light from the BSY LEDs $\mathbf{52}_{BSY}$ may have a color point having coordinates that fall within the large BSY color space or the small BSY color space.

The second configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 410 to 490 nm; the dominant wavelength of the yellow phosphor associated with the BSY LEDs $\mathbf{52}_{BSY}$ is 535 to 590 nm; and the dominant wavelength of the red LEDs $\mathbf{52}_{R}$ is 641 to 700 nm. The light from the BSY LEDs $\mathbf{52}_{BSY}$ may have a color point having coordinates that fall within the large BSY color space or the small BSY color space.

The third configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 410 to 490 nm; the dominant wavelength of the yellow phosphor associated with the BSY LEDs $\mathbf{52}_{BSY}$ is 535 to 590 nm; and the dominant wavelength of the red LEDs $\mathbf{52}_{R}$ is 641 to 680 nm. The light from the BSY LEDs $\mathbf{52}_{BSY}$ may have a color point having coordinates that fall within the large BSY color space or the small BSY color space.

The fourth configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 430 to 480 nm; the dominant wavelength of the yellow phosphor associated with the BSY LEDs $\mathbf{52}_{BSY}$ is 566 to 585 nm; and the dominant wavelength of the red LEDs $\mathbf{52}_{R}$ is 631 to 680 nm. The light from the BSY LEDs $\mathbf{52}_{BSY}$ may have a color point having coordinates that fall within the large BSY color space or the small BSY color space.

The fifth configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 430 to 480 nm; the dominant wavelength of the yellow phosphor associated with the BSY LEDs $\mathbf{52}_{BSY}$ is 566 to 585 nm; and the dominant wavelength of the red LEDs $\mathbf{52}_{R}$ is 641 to 680 nm. The light from the BSY LEDs $\mathbf{52}_{BSY}$ may have a color point having coordinates that fall within the large BSY color space or the small BSY color space.

The sixth configuration for high CQS employs BSY LEDs $\mathbf{52}_{BSY}$ and red LEDs $\mathbf{52}_{R}$. The peak wavelength of the blue excitation light emitted by the blue LED chips 54 of the BSY LEDs $\mathbf{52}_{BSY}$ is 445 to 470 nm; the dominant wavelength of the yellow phosphor associated with the BSY LEDs $\mathbf{52}_{BSY}$ is 566 to 575 nm; and the dominant wavelength of the red LEDs $\mathbf{52}_{R}$ is 605 to 650 nm. The light from the BSY LEDs $\mathbf{52}_{BSY}$ may have a color point having coordinates that fall within the large BSY color space or the small BSY color space. Further, the resultant white light between about 2700K and 4000K may obtain a CQS measurement equal to or greater than 90.

For a more optimized CQS measure greater than 90 and for white light between 2700K and 4000K, the peak wavelength of the blue excitation light emitted by the blue LED chips 54 of the BSY LEDs $\mathbf{52}_{BSY}$ is 448 to 468 nm; the dominant wavelength of the yellow phosphor associated with the BSY LEDs $\mathbf{52}_{BSY}$ is 568 to 573 nm; and the dominant wavelength of the red LEDs $\mathbf{52}_{R}$ is 615 to 645 nm. The light from the BSY LEDs $\mathbf{52}_{BSY}$ may have a color point having coordinates that fall within the large BSY color space or the small BSY color space.

For a CQS measure of 85 or greater, the peak wavelength of the blue excitation light emitted by the blue LED chips 54 of the BSY LEDs $\mathbf{52}_{BSY}$ is 430 to 480 nm; the dominant wavelength of the yellow phosphor associated with the BSY LEDs $\mathbf{52}_{BSY}$ is 560 to 580 nm; and the dominant wavelength of the red LEDs $\mathbf{52}_{R}$ is 605 to 660 nm. The light from the BSY LEDs $\mathbf{52}_{BSG}$ may have a color point having coordinates that fall within the large BSY color space or the small BSY color space. Again, the resultant white light is between about 2700K and 4000K.

The seventh configuration for high CQS employs BSG LEDs $\mathbf{52}_{BSG}$ and red LEDs $\mathbf{52}_{R}$. The peak wavelength of the blue excitation light emitted by the blue LED chips 54 of the BSG LEDs $\mathbf{52}_{BSG}$ is 430 to 480 nm; the dominant wavelength of the green phosphor associated with the BSG LEDs $\mathbf{52}_{BSG}$ is 540 to 560 nm; and the dominant wavelength of the red LEDs $\mathbf{52}_{R}$ is 605 to 640 nm. The light from the BSG LEDs $\mathbf{52}_{BSG}$ may have a color point having coordinates that fall within the large BSG color space or the small BSG color space. Further, the resultant white light between about 4000K and 6500K may obtain a CQS measurement equal to or greater than 90.

For a more optimized CQS measure greater than 90 and for white light between 4000K and 6500K, the peak wavelength of the blue excitation light emitted by the blue LED chips 54 of the BSG LEDs $\mathbf{52}_{BSG}$ is 430 to 470 nm; the dominant wavelength of the green phosphor associated with the BSG LEDs $\mathbf{52}_{BSG}$ is 540 to 560 nm; and the dominant wavelength of the red LEDs $\mathbf{52}_{R}$ is 609 to 630 nm. The light from the BSG LEDs $\mathbf{52}_{BSG}$ may have a color point having coordinates that fall within the large BSG color space or the small BSG color space.

For a CQS measure of 85 or greater, the peak wavelength of the blue excitation light emitted by the blue LED chips 54 of the BSG LEDs $52_{BSG}$ is 420 to 480 nm; the dominant wavelength of the green phosphor associated with the BSG LEDs $52_{BSG}$ is 540 to 560 nm; and the dominant wavelength of the red LEDs $52_R$ is 590 to 660 nm. The light from the BSG LEDs $52_{BSG}$ may have a color point having coordinates that fall within the large BSG color space or the small BSG color space. Again, the resultant white light is between about 4000K and 6500K.

The eighth configuration for high CQS employs red LEDs and either BSY or BSG LEDs. The peak wavelength of the blue excitation light emitted by the blue LED chips 54 of the BSY or BSG LEDs is 410 to 490 nm; the dominant wavelength of the yellow or green phosphor associated with the BSY or BSG LEDs is 535 to 590 nm; and the dominant wavelength of the red LEDs is 590 to 700 nm. The light from the BSG LEDs may have a color point having coordinates that fall within the small or large BSY color space for BSY LEDs or the small or large BSG color space for the BSG LEDs. In this configuration, peak wavelength of the blue excitation light emitted by the blue LED chips 54 of the BSY or BSG LEDs, the dominant wavelength of the yellow or green phosphor associated with the BSY or BSG LEDs, and the dominant wavelength of the red LEDs can be selected to provide one of the following characteristics:

a CQS measurement ≥90;

a CQS measurement ≥85;

a CQS measurement ≥90 and a CRI $R_a$≥90;

a CQS measurement ≥85 and a CRI $R_a$≥85;

a CQS measurement ≥90 and a CRI $R_a$<90; and a CQS measurement ≥85 and a CRI $R_a$<85;

By comparing the CQS and CRI diagrams in the various embodiments of FIGS. 10A and 10B through 14A and 14B, exemplary areas that fulfill each of the above listed characteristics are readily apparent. While various color spaces have been identified above, other color spaces for phosphor coated LEDs may be applicable. For instance, the color space defined by an area bounded by the coordinates [(0.59, 0.24) (0.40, 0.50) (0.24, 0.53) (0.17, 0.25) (0.30, 0.12)] of the 1931 Chromaticity Diagram may be provided. As another example, the color space defined by an area bounded by the coordinates [(0.41, 0.45) (0.37, 0.47) (0.25, 0.27) (0.29, 0.24)] of the 1931 Chromaticity Diagram may be provided.

Notably, the white light provided by each of the above configurations may fall within ten, seven, or four MacAdam ellipses of the BBL for each of the different embodiments, and the light measurements are taken assuming there is an absence of ambient light. Based on these illustrations and teachings provided herein, those skilled in the art will be able design solid-state lighting devices that can meet one or more of the above characteristics with varying configurations. These embodiments are considered within the scope of this disclosure and the following claims.

Further, the specific configuration of the lighting fixture 10 may take many forms. For example, the concepts disclosed herein may be provided in virtually any type of lighting fixture, such as lighting fixtures 10A, 10B, 10C, and 10D of FIGS. 20-23, respectively.

Those skilled in the art will recognize improvements and modifications to the embodiments of the present disclosure. All such improvements and modifications are considered within the scope of the concepts disclosed herein and the claims that follow.

What is claimed is:

1. A lighting device comprising:

a first plurality of solid-state light emitters wherein each of the first plurality of solid-state light emitters is associated with a wavelength conversion material;

a second plurality of solid-state light emitters; and current control circuitry adapted to provide current to the first and second pluralities of solid-state light emitters such that:

a peak wavelength of excitation light emitted by the first plurality of solid-state light emitters is from 410 nm to 490 nm;

a dominant wavelength of light emitted by the wavelength conversion material is from 535 nm to 590 nm when excited by the excitation light emitted by the first plurality of solid-state light emitters; and a dominant wavelength of light emitted by the second plurality of solid-state light emitters is from 631 nm to 700 nm, wherein a combination of light emitted by the first and second pluralities of solid-state light emitters and the wavelength conversion material produces white light at a color point on a 1931 CIE chromaticity diagram within ten MacAdam ellipses of a black body locus.

2. The lighting device of claim 1 wherein the wavelength conversion material is a yellow phosphor that emits yellowish light when excited by the excitation light and each of the first plurality of solid-state light emitters is a blue-shifted yellow (BSY) light emitting diode (LED) comprising a blue LED chip that emits bluish light and is associated with the yellow phosphor.

3. The lighting device of claim 2 wherein the combination of light emitted by the first plurality of solid-state light emitters and the wavelength conversion material produces light having a color point on the 1931 CIE chromaticity diagram that falls within a color space defined by a set of points with x, y coordinates: (0.29, 0.36), (0.38, 0.53), (0.44,0.49), (0.41, 0.43), and (0.32, 0.35).

4. The lighting device of claim 2 wherein the combination of light emitted by the first plurality of solid-state light emitters and the wavelength conversion material produces light having a color point on the 1931 CIE chromaticity diagram that falls within a color space defined by a set of points with x, y coordinates: (0.32, 0.40), (0.36, 0.48), (0.43,0.45), (0.42, 0.42), and (0.36, 0.38).

5. The lighting device of claim 2 wherein the dominant wavelength of light emitted by the second plurality of solid-state light emitters is from 641 nm to 700 nm.

6. The lighting device of claim 2 wherein the dominant wavelength of light emitted by the second plurality of solid-state light emitters is from 641 nm to 680 nm.

7. The lighting device of claim 2 wherein the dominant wavelength of light emitted by the wavelength conversion material is from 566 nm to 585 nm when excited by the excitation light emitted by the first plurality of solid-state light emitters and the dominant wavelength of light emitted by the second plurality of solid-state light emitters is from 631 nm to 680 nm.

8. The lighting device of claim 2 wherein the dominant wavelength of light emitted by the wavelength conversion material is from 566 nm to 585 nm when excited by the excitation light emitted by the first plurality of solid-state light emitters and the dominant wavelength of light emitted by the second plurality of solid-state light emitters is from 641 nm to 680 nm.

9. The lighting device of claim 2 wherein the peak wavelength of excitation light emitted by the first plurality of solid-state light emitters is from 430 nm to 480 nm; the dominant wavelength of light emitted by the wavelength conversion material is from 566 nm to 585 nm when excited by the excitation light emitted by the first plurality of solid-state light emitters; and the dominant wavelength of light emitted by the second plurality of solid-state light emitters is from 641 nm to 680 nm.

10. The lighting device of claim 1 wherein the wavelength conversion material is a green phosphor that emits greenish light when excited by the excitation light and each of the first plurality of solid-state light emitters is a blue-shifted green (BSG) light emitting diode (LED) comprising a blue LED chip that emits bluish light and is associated with the green phosphor.

11. The lighting device of claim 10 wherein the combination of light emitted by the first plurality of solid-state light emitters and the wavelength conversion material produces light having a color point on the 1931 CIE chromaticity diagram that falls within a color space defined by a set of points with x, y coordinates: (0.13, 0.26), (0.35, 0.48), (0.26, 0.50), and (0.15, 0.20).

12. The lighting device of claim 10 wherein the combination of light emitted by the first plurality of solid-state light emitters and the wavelength conversion material produces light having a color point on the 1931 CIE chromaticity diagram that falls within a color space defined by a set of points with x, y coordinates: (0.21, 0.28), (0.28, 0.44), (0.32, 0.42), and (0.26, 0.28).

13. The lighting device of claim 1 wherein the white light has a color quality scale measurement equal to or greater than 90.

14. The lighting device of claim 1 wherein the white light has a color quality scale measurement equal to or greater than 90 and a color rendering index Ra equal to or greater than 90.

15. The lighting device of claim 1 wherein the white light has a color quality scale measurement equal to or greater than 85.

16. The lighting device of claim 1 wherein the white light has a color quality scale measurement equal to or greater than 85 and a color rendering index Ra equal to or greater than 85.

17. The lighting device of claim 1 wherein the white light has a color quality scale measurement equal to or greater than 90 and a color rendering index Ra less than 90.

18. The lighting device of claim 1 wherein the white light has a color quality scale measurement equal to or greater than 85 and a color rendering index Ra less than 85.

19. A lighting device comprising:

a first plurality of solid-state light emitters wherein each of the first plurality of solid-state light emitters is associated with a wavelength conversion material;

a second plurality of solid-state light emitters; and current control circuitry adapted to provide current to the first and second pluralities of solid-state light emitters such that a combination of light emitted by the first and second pluralities of solid-state light emitters and the wavelength conversion material produces white light at a color point on a 1931 CIE chromaticity diagram within ten MacAdam ellipses of a black body locus and having a color quality scale measurement equal to or greater than 85.

20. The lighting device of claim 19 wherein:

a peak wavelength of excitation light emitted by the first plurality of solid-state light emitters is from 410 nm to 490 nm;

a dominant wavelength of light emitted by the wavelength conversion material is from 535 nm to 590 nm when excited by the excitation light emitted by the first plurality of solid-state light emitters; and a dominant wavelength of light emitted by the second plurality of solid-state light emitters is from is 590 nm to 700 nm.

21. The lighting device of claim 20 wherein the peak wavelength of excitation light emitted by the first plurality of solid-state light emitters is from 445 nm to 470 nm; the dominant wavelength of light emitted by the wavelength conversion material is from 566 nm to 575 nm when excited by the excitation light emitted by the first plurality of solid-state light emitters; and the dominant wavelength of light emitted by the second plurality of solid-state light emitters is from 605 nm to 650 nm.

22. The lighting device of claim 21 wherein the white light has a color quality scale measurement equal to or greater than 90.

23. The lighting device of claim 22 wherein the white light has a color temperature between about 2700K and 4000K.

24. The lighting device of claim 20 wherein the peak wavelength of excitation light emitted by the first plurality of solid-state light emitters is from 448 nm to 468 nm; the dominant wavelength of light emitted by the wavelength conversion material is from 568 nm to 573 nm when excited by the excitation light emitted by the first plurality of solid-state light emitters; and the dominant wavelength of light emitted by the second plurality of solid-state light emitters is from 615 nm to 645 nm.

25. The lighting device of claim 24 wherein the white light has a color quality scale measurement equal to or greater than 90.

26. The lighting device of claim 25 wherein the white light has a color temperature between about 2700K and 4000K.

27. The lighting device of claim 20 wherein the peak wavelength of excitation light emitted by the first plurality of solid-state light emitters is from 430 nm to 480 nm; the dominant wavelength of light emitted by the wavelength conversion material is from 560 nm to 580 nm when excited by the excitation light emitted by the first plurality of solid-state light emitters; and the dominant wavelength of light emitted by the second plurality of solid-state light emitters is from 605 nm to 660 nm.

28. The lighting device of claim 27 wherein the white light has a color temperature between about 2700K and 4000K.

29. The lighting device of claim 20 wherein the peak wavelength of excitation light emitted by the first plurality of solid-state light emitters is from 430 nm to 480 nm; the dominant wavelength of light emitted by the wavelength conversion material is from 540 nm to 560 nm when excited by the excitation light emitted by the first plurality of solid-state light emitters; and the dominant wavelength of light emitted by the second plurality of solid-state light emitters is from 605 nm to 640 nm.

30. The lighting device of claim 29 wherein the white light has a color temperature between about 4000K and 6500K.

31. The lighting device of claim 30 wherein the white light has a color quality scale measurement equal to or greater than 90.

32. The lighting device of claim 20 wherein the peak wavelength of excitation light emitted by the first plurality of solid-state light emitters is from 430 nm to 470 nm; the dominant wavelength of light emitted by the wavelength conversion material is from 540 nm to 560 nm when excited by the excitation light emitted by the first plurality of solid-state light emitters; and the dominant wavelength of light emitted by the second plurality of solid-state light emitters is from 609 nm to 630 nm.

33. The lighting device of claim 32 wherein the white light has a color temperature between about 4000K and 6500K.

34. The lighting device of claim 33 wherein the white light has a color quality scale measurement equal to or greater than 90.

35. The lighting device of claim 20 wherein the peak wavelength of excitation light emitted by the first plurality of solid-state light emitters is from 420 nm to 480 nm; the dominant wavelength of light emitted by the wavelength conversion material is from 540 nm to 560 nm when excited by the excitation light emitted by the first plurality of solid-state light emitters; and the dominant wavelength of light emitted by the second plurality of solid-state light emitters is from 590 nm to 660 nm.

36. The lighting device of claim 35 wherein the white light has a color temperature between about 4000K and 6500K.

37. The lighting device of claim 20 wherein the white light has a color quality scale measurement equal to or greater than 90 and a color rendering index Ra equal to or greater than 90.

38. The lighting device of claim 20 wherein the white light has a color rendering index Ra equal to or greater than 85.

39. The lighting device of claim 20 wherein the white light has a color quality scale measurement equal to or greater than 90 and a color rendering index Ra less than 20.

40. The lighting device of claim 20 wherein the white light has a color quality scale measurement equal to or greater than 85 and a color rendering index Ra less than 85.

41. The lighting device of claim 20 wherein the white light has a color quality scale measurement equal to or greater than 90.

42. The lighting device of claim 41 wherein the wavelength conversion material is a green phosphor that emits greenish light when excited by the excitation light and each of the first plurality of solid-state light emitters is a blue-shifted green (BSG) light emitting diode (LED) comprising a blue LED chip that emits bluish light and is associated with the green phosphor.

43. The lighting device of claim 42 wherein the combination of light emitted by the first plurality of solid-state light emitters and the wavelength conversion material produces light having a color point on the 1931 CIE chromaticity diagram that falls within a color space defined by a set of points with x, y coordinates: (0.13, 0.26), (0.35, 0.48), (0.26, 0.50), and (0.15, 0.20).

44. The lighting device of claim 42 wherein the combination of light emitted by the first plurality of solid-state light emitters and the wavelength conversion material produces light having a color point on the 1931 CIE chromaticity diagram that falls within a color space defined by a set of points with x, y coordinates: (0.21, 0.28), (0.28, 0.44), (0.32, 0.42), and (0.26, 0.28).

45. The lighting device of claim 41 wherein the wavelength conversion material is a yellow phosphor that emits yellowish light when excited by the excitation light and each of the first plurality of solid-state light emitters is a blue-shifted yellow (BSY) light emitting diode (LED) comprising a blue LED chip that emits bluish light and is associated with the yellow phosphor.

46. The lighting device of claim 45 wherein the combination of light emitted by the first plurality of solid-state light emitters and the wavelength conversion material produces light having a color point on the 1931 CIE chromaticity diagram that falls within a color space defined by a set of points with x, y coordinates: (0.29, 0.36), (0.38, 0.53), (0.44, 0.49), (0.41, 0.43), and (0.32, 0.35).

47. The lighting device of claim 45 wherein the combination of light emitted by the first plurality of solid-state light emitters and the wavelength conversion material produces light having a color point on the 1931 CIE chromaticity diagram that falls within a color space defined by a set of points with x, y coordinates: (0.32, 0.40), (0.36, 0.48), (0.43, 0.45), (0.42, 0.42), and (0.36, 0.38).

48. The lighting device of claim 19 wherein the combination of light emitted by the first plurality of solid-state light emitters and the wavelength conversion material produces light having a color point on the 1931 CIE chromaticity diagram that falls within a color space defined by a set of points with x, y coordinates: (0.59, 0.24) (0.40, 0.50) (0.24, 0.53) (0.17, 0.25) and (0.30, 0.12).

49. The lighting device of claim 19 wherein the combination of light emitted by the first plurality of solid-state light emitters and the wavelength conversion material produces light having a color point on the 1931 CIE chromaticity diagram that falls within a color space defined by a set of points with x, y coordinates: (0.41, 0.45) (0.37, 0.47) (0.25, 0.27) and (0.29, 0.24).

* * * * *